US012212040B2

(12) United States Patent
Hobbs et al.

(10) Patent No.: US 12,212,040 B2
(45) Date of Patent: Jan. 28, 2025

(54) RECONFIGURABLE SECURE ANTENNA MODULE AND ASSEMBLY METHOD

(71) Applicant: Dell Products, LP, Round Rock, TX (US)

(72) Inventors: Derric C. Hobbs, Round Rock, TX (US); Jake H. Lavallo, Austin, TX (US); Jonathan C. Giffen, Austin, TX (US); Suresh K. Ramasamy, Cedar Park, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 639 days.

(21) Appl. No.: 17/512,036

(22) Filed: Oct. 27, 2021

(65) Prior Publication Data

US 2023/0130508 A1 Apr. 27, 2023

(51) Int. Cl.
*H01Q 1/22* (2006.01)
*G06F 1/16* (2006.01)
(Continued)

(52) U.S. Cl.
CPC ......... *H01Q 1/2291* (2013.01); *G06F 1/1683* (2013.01); *G06F 1/1698* (2013.01);
(Continued)

(58) Field of Classification Search
CPC .......... H04Q 2201/04; H04Q 2201/10; H01Q 1/2275; H01Q 1/2291; H01Q 1/1207;
(Continued)

(56) References Cited

U.S. PATENT DOCUMENTS 6,111,548 A * 8/2000 Braunlich ............ H02B 13/065
343/789
6,766,402 B1 * 7/2004 Agata ................... G06F 1/1637
439/11
(Continued)

FOREIGN PATENT DOCUMENTS

CN 105591291 A * 5/2016 ............... H02B 1/28
CN 113495600 A * 10/2021 ............. G06F 3/041
(Continued)

*Primary Examiner* — Ricardo I Magallanes
(74) *Attorney, Agent, or Firm* — Prol Intellectual Property Law, PLLC; H. Kenneth Prol

(57) ABSTRACT

A secure antenna chassis access for an information handling system reconfigurable antenna may comprise a chassis enclosing the information handling system including a top cover, and a rear chassis wall, an antenna mounting insertion slot within the rear chassis wall, a reconfigurable antenna grounding bracket with an internal mounting portion configured to mount internally to the chassis via an internal fastener, a hardwired antenna operably coupled to a Wireless Local Area Network (WLAN) network interface device of the information handling system via an electrically conductive wire to transceive data at or above 6 GHz frequency, the hardwired antenna operably disposed through the antenna mounting insertion slot of the rear chassis wall from the interior of the chassis and coupled to the reconfigurable antenna grounding bracket internally mounted to the chassis, and an antenna security cover enclosing the hardwired antenna and removable by internal access to the chassis.

20 Claims, 23 Drawing Sheets

(51) Int. Cl.
  *H01Q 1/48* (2006.01)
  *H01Q 9/04* (2006.01)
  *H02B 1/30* (2006.01)
  *H04M 1/02* (2006.01)
  *H05K 5/02* (2006.01)
(52) U.S. Cl.
  CPC ............. *H01Q 1/48* (2013.01); *H01Q 9/0421* (2013.01); *H02B 1/301* (2013.01); *H04M 1/026* (2013.01); *H05K 5/0221* (2013.01)
(58) Field of Classification Search
  CPC ......... H01Q 1/38; G06F 1/181; G06F 1/1632; G06F 9/4411
  See application file for complete search history.

(56) References Cited

U.S. PATENT DOCUMENTS

| | | | |
|---|---|---|---|
| 6,950,069 | B2 | 9/2005 | Gaucher |
| 7,602,341 | B2 | 10/2009 | Wei-Shan |
| 7,940,223 | B2 | 5/2011 | Dou |
| 8,049,671 | B2 | 11/2011 | Nysen |
| 9,490,535 | B2 | 11/2016 | Boutayeb |
| 10,219,389 | B2 | 2/2019 | Islam |
| 2004/0150571 | A1* | 8/2004 | Deng ................ G06F 1/181 343/702 |
| 2010/0207826 | A1 | 8/2010 | Ryou |
| 2018/0254540 | A1* | 9/2018 | Yoo ................. H01Q 1/243 |
| 2020/0186900 | A1* | 6/2020 | Ishihara ............ H01Q 9/42 |
| 2020/0266520 | A1* | 8/2020 | Moon ............... H04M 1/0249 |
| 2023/0350467 | A1* | 11/2023 | Chang ............... G06F 1/1681 |

FOREIGN PATENT DOCUMENTS

| | | | | |
|---|---|---|---|---|
| DE | 102009044046 A1 | * | 3/2011 | ............... H01Q 1/22 |
| EP | 1805847 B1 | | 12/2008 | |
| EP | 3563451 B1 | * | 4/2022 | ........... G06F 1/1616 |
| WO | WO-2004032354 A1 | * | 4/2004 | ........... G06F 1/1632 |
| WO | WO-2008094214 A1 | * | 8/2008 | ............. B29C 59/16 |
| WO | 2012/078566 A2 | | 6/2012 | |
| WO | WO-2016156961 A1 | * | 10/2016 | ............... H01Q 1/22 |
| WO | WO-2019224101 A1 | * | 11/2019 | ........... H01Q 1/2291 |
| WO | WO-2022065856 A1 | * | 3/2022 | ............. B23K 26/21 |
| WO | WO-2022186514 A1 | * | 9/2022 | ........... H01Q 1/2283 |
| WO | WO-2023182706 A1 | * | 9/2023 | ............... H01Q 1/24 |

* cited by examiner

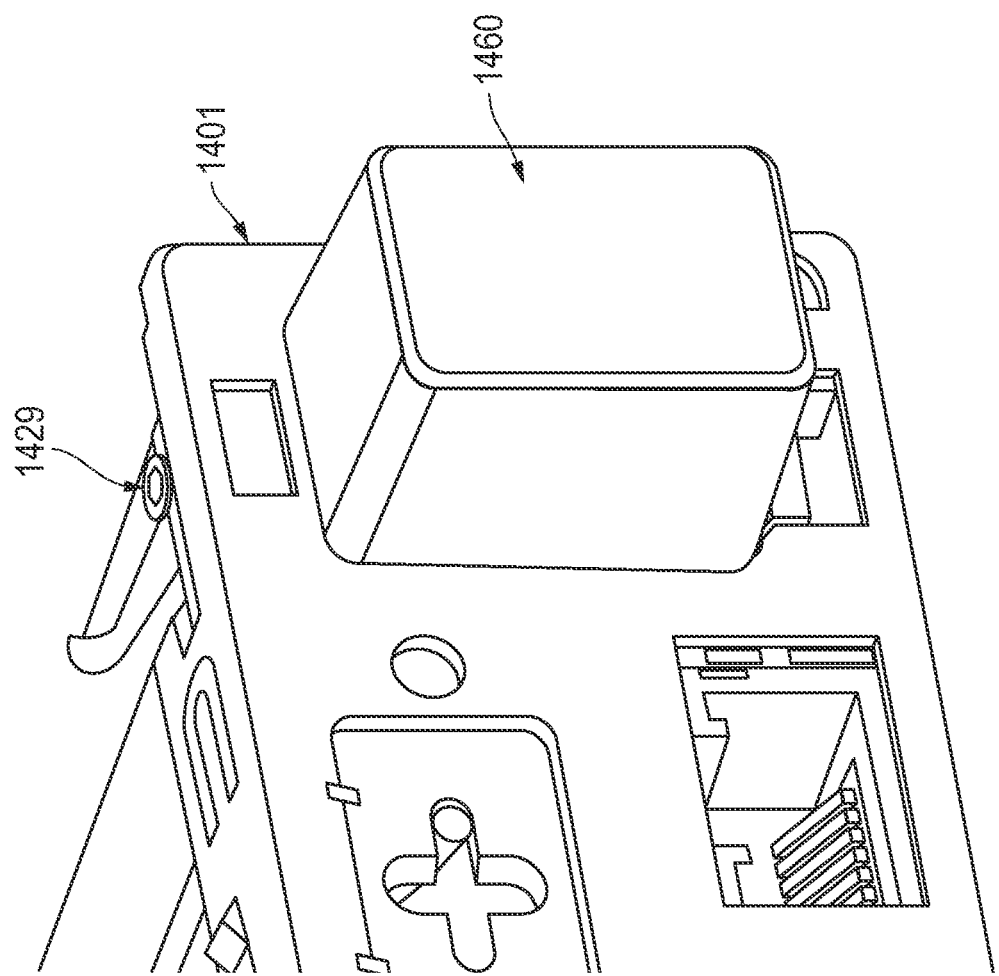

RECONFIGURABLE SECURE ANTENNA MODULE AND ASSEMBLY METHOD

FIELD OF THE DISCLOSURE

The present disclosure generally relates to transceiving of wireless data via one or more antennas. The present disclosure more specifically relates to a reconfigurable antenna module design for securely mounting various types of antennas capable of transceiving Wi-Fi data at frequencies at or above 6 GHz to a rear wall of a chassis enclosing an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities utilizing wireless connectivity.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 14C is a cut-away view of an antenna security cover affixed to an exterior surface of a chassis rear wall according to an embodiment of the present disclosure;

The use of the same reference symbols in different drawings may indicate similar or identical items.

DETAILED DESCRIPTION OF THE DRAWINGS

Figure 1:
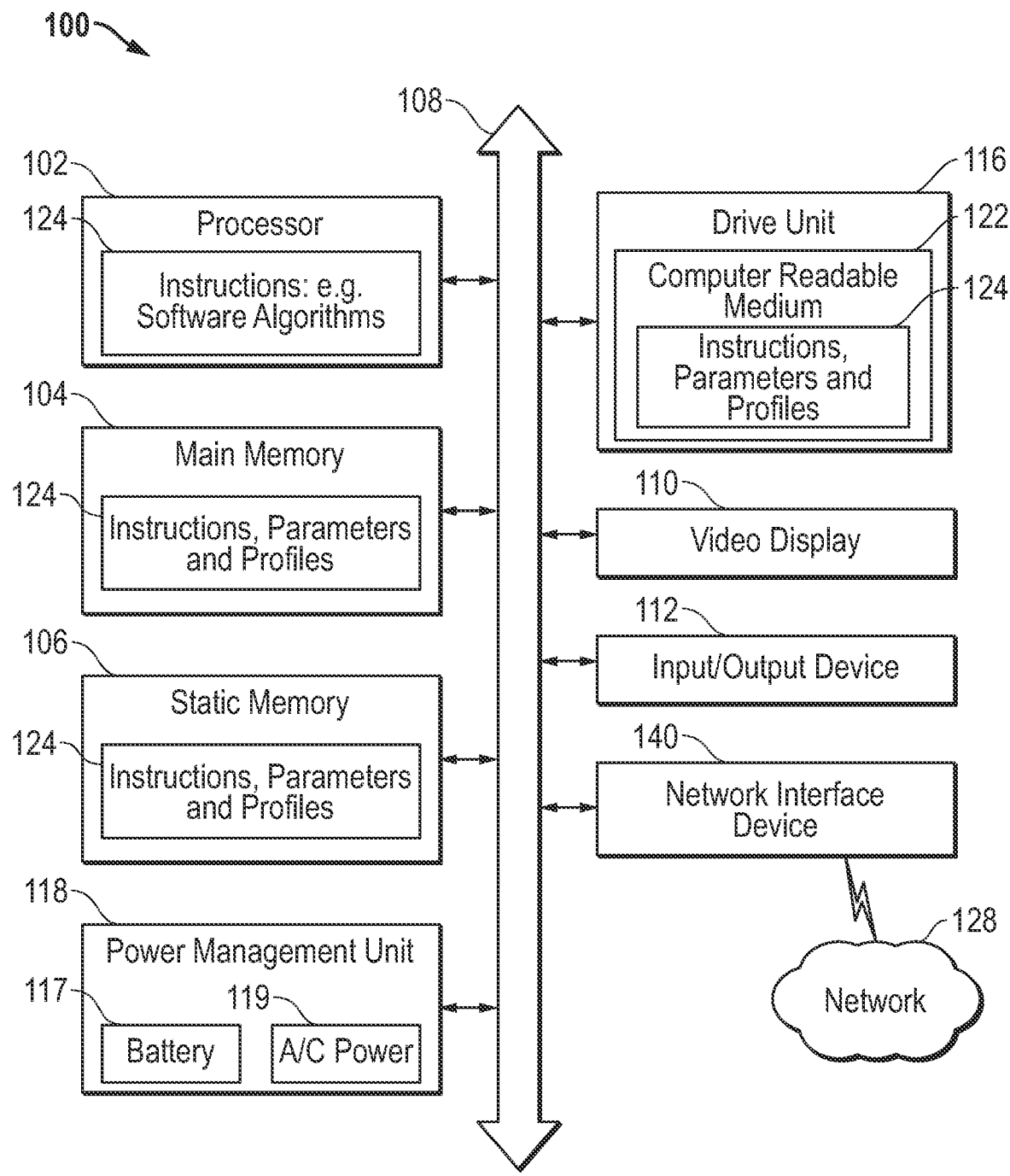
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

New wireless radios for the emerging Institute of Electrical and Electronics Engineers (IEEE) 802.11ax and later standards, marketed by the Wi-Fi Alliance as "Wi-Fi 6E" may extend the frequency range of transmissions to those above 6 GHZ, necessitating a change to previous antenna designs supporting transceiving of data within the 2.4 GHz and 5 GHz frequency spectra. Chassis designs for information handling systems seek to optimize usage of physical space, usage of antenna grounding structures, and the need for external ports disposed through the walls of the chassis. In other words, chassis design focuses upon conserving space within the chassis to minimize the size of the overall system.

In previous chassis designs, space and port constraints limited the number of antennas disposed internally within the chassis to one antenna (e.g., planar inverted F-antenna or PIFA antenna). In order to increase connectivity or frequency spectra available to information handling systems enclosed within such previous chassis designs, secondary antennas having been added for dual antenna Wi-Fi solutions. For example, such previous chassis designs may have allowed for attachment of an external Dipole Whip antenna or operably connecting a detachable antenna puck to the information handling system via sub-miniature version A (SMA) coaxial cable adapters mounted to a rear wall of the chassis. External dipole whips used in such a manner are associated with a marked increase in cost and are an obtrusive appendage extending beyond the exterior surface of the chassis. Detachable antenna pucks in previous systems could be easily detached from the information handling system and stolen. Further, chassis constraints in these previous designs prohibit inclusion of a second, lower-cost hardwired antenna (e.g., PIFA) within the interior of the chassis. A lower-cost solution that securely mounts an antenna or a portion of an antenna module capable of transceiving within the 6 GHz Wi-Fi 6E spectrum within the chassis of the information handling system, without increasing the chassis base size or creating new input/output (I/O) ports within the chassis rear wall is needed.

Embodiments of the present disclosure address these issues by assembling an antenna module that may be configured to incorporate several different types of antennas for mounting to the exterior rear wall of the chassis through a re-purposed SMA adapter port already included within previous chassis designs. Such an antenna module may be assembled in various embodiments described herein by operably connecting one of a variety of different types of antennas (e.g., PIFA, Laser Direct Structure or "LDS," or extendable puck antenna) to the network interface device of the information handling system and to a reconfigurable antenna grounding bracket. In embodiments, the reconfigurable antenna grounding bracket may be adaptable for use with each of the variety of antennas, and may be configured for mounting internally within the chassis. In embodiments incorporating an antenna (e.g., PIFA or LDS) that is operably connected directly to a network interface device via an electrically conductive wire (e.g., "hardwired" to the electrically conductive wire with soldering), for example, the antenna may be housed within an antenna holder secured to the reconfigurable antenna grounding bracket via one or more fastening arms.

In embodiments in which the antenna (e.g., extendable puck antenna transceiving data within the Wi-Fi 6E 6 GHz frequency spectrum) is operably connected to the network interface device via one or more SMA adapters, which may be referred to herein as "SMA antennas," SMA adapter apertures may be machined through the reconfigurable antenna grounding bracket, and SMA adapters operably connected to the network interface device of the information handling system may be partially inserted through those apertures. The SMA adapters may be secured to the reconfigurable antenna grounding bracket via one or more SMA adapter nuts.

The antenna portion of the antenna module in both such embodiments described directly above may be inserted from the interior of the chassis through the re-purposed SMA adapter port. This antenna portion may include a hardwired antenna and antenna holder in some embodiments, or may include one or more SMA adapters in other embodiments.

The reconfigurable antenna grounding bracket affixed to the antenna portion of the antenna module inserted through the chassis in such a way may remain within the interior of the chassis, and may be mechanically mounted to the interior of the chassis via an internal fastener, such as a screw. The internal fastener may thus only be accessible from the interior of the chassis. The rear wall of the chassis may be joined with a top cover and a bottom cover, or side covers of the chassis to obstruct access to the interior of the chassis. In such a way, access to all fasteners for the reconfigurable antenna module mounted partially within the interior of the chassis and partially secured to the exterior of the rear wall of the chassis by the antenna module fastening arms affixed to the reconfigurable grounding bracket may be inhibited by the top cover and other covers of the chassis.

In order to ensure security of the antenna, or to inhibit easy removal of the antenna during use of the information handling system, an antenna security cover enclosing the antenna portion of the antenna assembly in embodiments described herein may be securely fastened to the rear wall of the chassis. For example, in embodiments employing a hardwired antenna, the antenna security cover may be fastened to the rear wall of the chassis via one or more fastening arms of the antenna security cover being disposed through security cover apertures formed within the reconfigurable antenna grounding bracket mechanically mounted to the interior of the chassis, as described directly above. As another example, in an embodiment employing SMA adapters within the antenna portion, an SMA antenna security cover may inhibit access to SMA adapters of an extendable puck antenna that are operably connected to the SMA adapters affixed to the rear wall of the chassis. Such an SMA antenna security cover may be fastened to the rear wall of the chassis via one or more fastening arms of the SMA antenna security cover being disposed through security cover apertures formed within the rear chassis wall itself. In both such designs, the security cover fastening arms may be accessible only from the interior of the chassis. In such a way, various embodiments described herein may provide a low-cost solution that securely mounts an antenna or a portion of an antenna module capable of transceiving within the 6 GHz Wi-Fi 6E spectrum within the chassis of the information handling system, without increasing the chassis base size or creating new input/output (I/O) ports within the chassis rear wall.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a pager, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system may include memory (volatile (e.g., random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 may include one or more storage devices, one or more communications ports for communicating with external devices, as well as, various input and output (I/O) devices 112, such as a keyboard, mouse, touchpad, or any combination thereof. The information handling system 100 may further include a video display 110. The video display 110 in an embodiment may function as a liquid crystal display (LCD), an organic light emitting diode (OLED), a flat panel display, or a solid-state display.

The information handling system 100 may also include a power management unit 118 supplying power to the information handling system 100, via a battery 117 or an alternating current (A/C) power adapter 119, a video/graphic display 110, and one or more buses operable to transmit communications between the various hardware components. Portions of an information handling system 100 may themselves be considered information handling systems 100. In an embodiment, the PMU 118 may be electrically coupled to the bus 108 to provide this power. The PMU 118 may regulate power from a power source such as a battery 117 or A/C power adapter 119. In an embodiment, the battery 117 may be charged via the A/C power adapter 119 and provide power the to the components of the information handling system 100 when A/C power from the A/C power adapter 119 is removed.

The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100. The information handling system 100 may include a processor 102 such as a central processing unit (CPU), control logic or some combination of the same. Any of the processing resources may operate to execute code that is either firmware or software code. Specifically, the processor 102 may operate to execute code instructions of firmware for the video/graphics display 110 in an embodiment. Moreover, the information handling system 100 may include memory such as main memory 104, static memory 106, or other memory of computer readable medium 122 storing instructions 124 of various applications, and drive unit 116 (volatile (e.g., random-access memory, etc.), nonvolatile memory (read-only memory, flash memory etc.) or any combination thereof. A processor 102 may further provide the information handling system with a system clock for which a time of day clock may be tracked along with any location detector such as global positioning system or in coordination with a network interface device 140 connecting to one or more networks 128. The information handling system 100 may also include one or more buses 108 operable to transmit communications between the various hardware components such as any combination of various input and output (I/O) devices.

The network interface device 140 may provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. The network interface device 140 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one network interface device 140 may operate two or more wireless links.

Network interface device 140 may connect to any combination of macro-cellular wireless connections including 2G, 2.5G, 3G, 4G, 5G or the like. Utilization of radiofrequency communication bands according to several example embodiments of the present disclosure may include bands used with the WLAN standards and WWAN carriers, which may operate in both licensed and unlicensed spectrums. Utilization of radiofrequency communication bands according to several example embodiments of the present disclosure may include bands used with the WLAN standards which may operate in both licensed and unlicensed spectrums. For example, WLAN may use the Unlicensed National Information Infrastructure (U-NII) band which typically operates in the 2.5 GHZ, 5 GHz, 6 GHZ, or greater than 6 GHz frequency bands such as 802.11 a/h/j/n/ac/ax. It is understood that any number of available channels may be available under the WLAN shared communication frequency bands. WLAN, for example, may also operate at a 2.4 GHz band, 5 GHZ, or a 60 GHz band. In a specific embodiment, the network interface device 140 may be capable of transceiving data according to the IEEE 802.11 ax standard defining Wi-Fi 6E frequencies at or above 6 GHz.

In various embodiments herein, the instructions 124 may execute any type of software applications. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs. In some embodiments, instructions 124 may comprise another application, such as executable code for a variety of software system applications.

The disk drive unit 116 may include a computer-readable medium 122 in which one or more sets of instructions 124 such as software may be embedded. Similarly, main memory 104 and static memory 106 may also contain a computer-readable medium for storage of one or more sets of instructions, parameters, or profiles 124. The disk drive unit 116 and static memory 106 may also contain space for data storage. In a particular embodiment, the instructions, parameters, and profiles 124 may reside completely, or at least partially, within the main memory 104, the static memory 106, and/or within the disk drive 116 during execution by the processor 102 of information handling system 100.

Main memory 104 may contain computer-readable medium, such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In a specific embodiment, the information handling system 100 may execute a basic input/output system (BIOS). In an embodiment, the processor 102 may communicate with the main memory 104, the processor 102, the video display 110, the input/output device 112, and the network interface device 140 via bus 108, and several forms of communication may be used, including ACPI, SMBus, a 24 MHZ BFSK-coded transmission channel, or shared memory. Keyboard or touchpad driver software, firmware, controllers and the like may communicate with applications on the information handling system 100. Similarly, video display driver software, firmware, controllers and the like may communicate with applications on the information handling system 100 as well as with the piezo keyboard driver in some embodiments herein. For example, video display 110 may include display scalar hardware operating to emit light at varying brightness levels via a plurality of pixels of the video display 110. Further, firmware for the video display 110 in an embodiment may operate to monitor changes in brightness at each of these pixels in order to detect pixel regions within the video display 110 undergoing changes in brightness (e.g., due to display of an explosion during live gameplay) indicating a gaming action event.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

Figure 2:
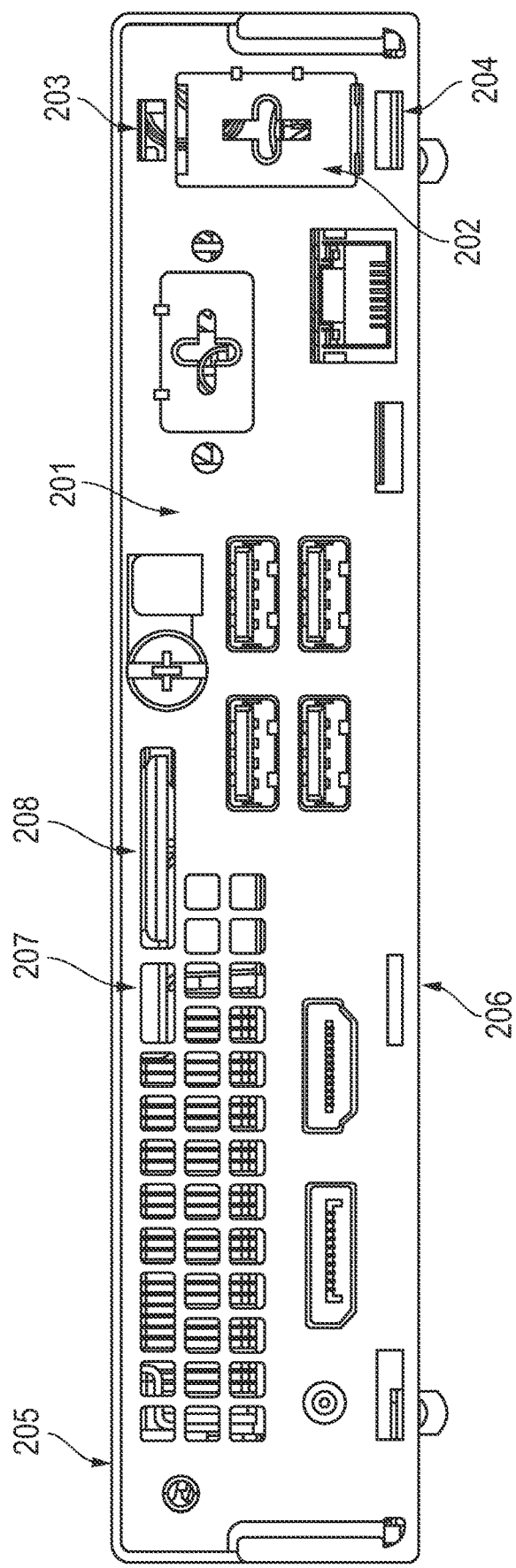
FIG. 2 is a rear view of an information handling system chassis with a port opening for insertion of an antenna module according to an embodiment of the present disclosure.

FIG. 2 is a rear view of an information handling system chassis with a port opening adapted for use with a plurality of antenna types according to an embodiment of the present disclosure. As described herein, the secure antenna chassis access for a reconfigurable antenna assembly in an embodiment may avoid addition of I/O ports to existing chassis designs, and thereby decrease manufacturing costs by repurposing existing I/O ports. For example, a secure antenna chassis access may repurpose a port previously assigned for mounting of SMA adapters. As shown in FIG. 2, the rear chassis wall 201 of the chassis enclosing the information handling system with top cover 205 and bottom cover 206 may include a removable antenna mounting insertion slot cover 202. This insertion slot cover 202 in an embodiment may be inserted within an SMA port aperture within the chassis wall initially designed for mounting of an SMA port in a previously existing chassis. The rear chassis wall 201 in an embodiment may further include a top chassis fastening arm aperture 203, or a bottom fastening arm aperture 204, either or both of which may be disposed through the rear chassis wall 201. As described in greater detail below with respect to FIGS. 17B, 17C, and 17D, one or more fastening arms of an antenna security cover may be disposed through one of these chassis fastening arm apertures (e.g., 203 or 204) to secure the antenna security cover and its contents to the rear wall 201 of the chassis.

The top cover 205 and bottom cover 206 may extend around the sides of the chassis as shown or may have separate side wall covers (not shown) in some embodiments. The top cover 205 in an embodiment may be secured to the chassis rear wall 201 via a Keyed Chassis Lock (K-Lock) inserted within a K-Lock aperture 207 within the rear wall 201 of the chassis. In another embodiment, the top cover 205 in an embodiment may be secured to the chassis rear wall 201 via a padlock inserted within a padlock loop aperture 208 within the rear wall 201 of the chassis. The padlock or K-lock in such embodiments may be opened with a lock or combination kept in the possession of the information handling system owner or system administrator (e.g., enterprise IT professional).

Figure 3:
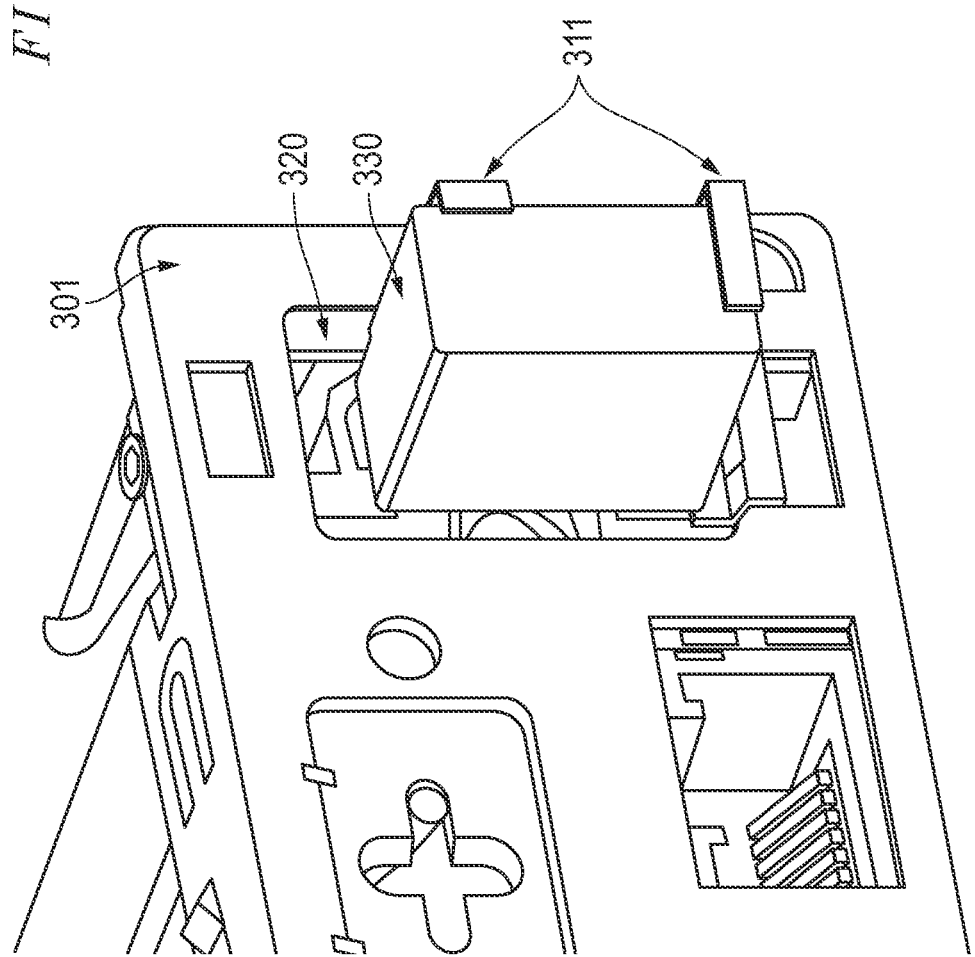
FIG. 3 is a perspective view of an antenna module mounted to an information handling system chassis rear wall according to an embodiment of the present disclosure.

FIG. 3 is a perspective view of an antenna module incorporating a reconfigurable antenna grounding bracket 320 and a PIFA antenna 311 mounted to an information handling system chassis rear wall 301 according to an embodiment of the present disclosure. As described herein, an antenna module in an embodiment that may be configured to incorporate several different types of antennas may be assembled for mounting to the exterior rear wall of the chassis through a re-purposed SMA adapter port already included within previous chassis designs. This may provide a low-cost solution for mounting of an antenna module capable of transceiving data within the 6 GHz Wi-Fi 6E spectrum, without increasing the chassis base size or creating new input/output (I/O) ports within the chassis rear wall 301.

For example, an antenna module comprising a reconfigurable antenna grounding bracket 320, a planar inverted F-Antenna (PIFA) 311, and an antenna holder 330 may be mounted to a rear chassis wall 301. More specifically, the antenna holder 330 and PIFA antenna 311 may be inserted through the chassis rear wall 301 (e.g., through an aperture beneath a removable antenna mounting insertion slot cover 202 described with reference to FIG. 2), and the reconfigurable antenna grounding bracket 320 may be affixed internally within the chassis against the inside of the chassis rear wall 301. In other embodiments, the antenna module may comprise various other types of antennas, such as described in an example embodiment below with respect to FIG. 4.

Figure 4:
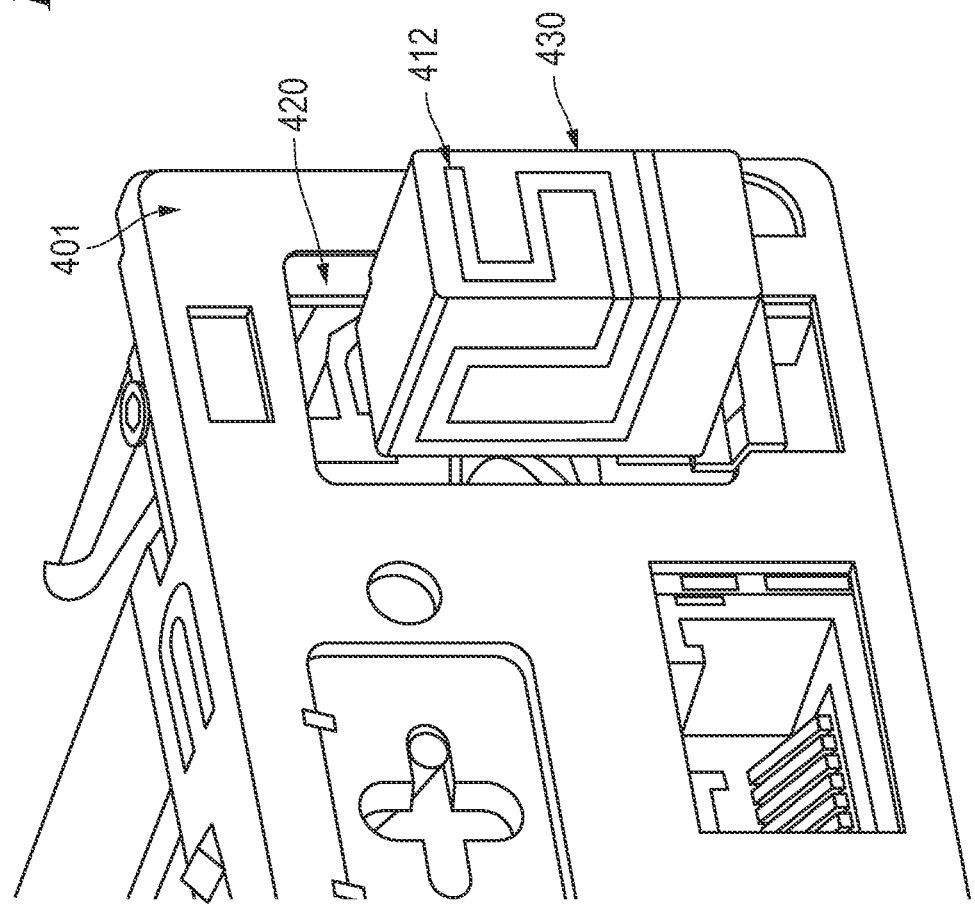
FIG. 4 is a perspective view of an antenna module mounted to an information handling system chassis rear wall according to an embodiment of the present disclosure.

FIG. 4 is a perspective view of an antenna module incorporating a reconfigurable antenna grounding bracket and an LDS antenna mounted to an information handling system chassis rear wall according to an embodiment of the present disclosure. For example, an antenna module comprising a reconfigurable antenna grounding bracket 420, an antenna holder 430, and a laser-direct structure (LDS) antenna 412 of a conductor etched into the antenna holder 430 may be mounted to a rear chassis wall 401. More specifically, the antenna holder 430 and LDS antenna 412 may be inserted through the chassis rear wall 401 (e.g., through an aperture beneath a removable antenna mounting insertion slot cover 202 described with reference to FIG. 2), and the reconfigurable antenna grounding bracket 420 may be affixed internally within the chassis against the inside of the chassis rear wall 401. In other embodiments, the antenna module may comprise various other types of antennas, such as described in an example embodiment above with respect to FIG. 3.

Figure 5:
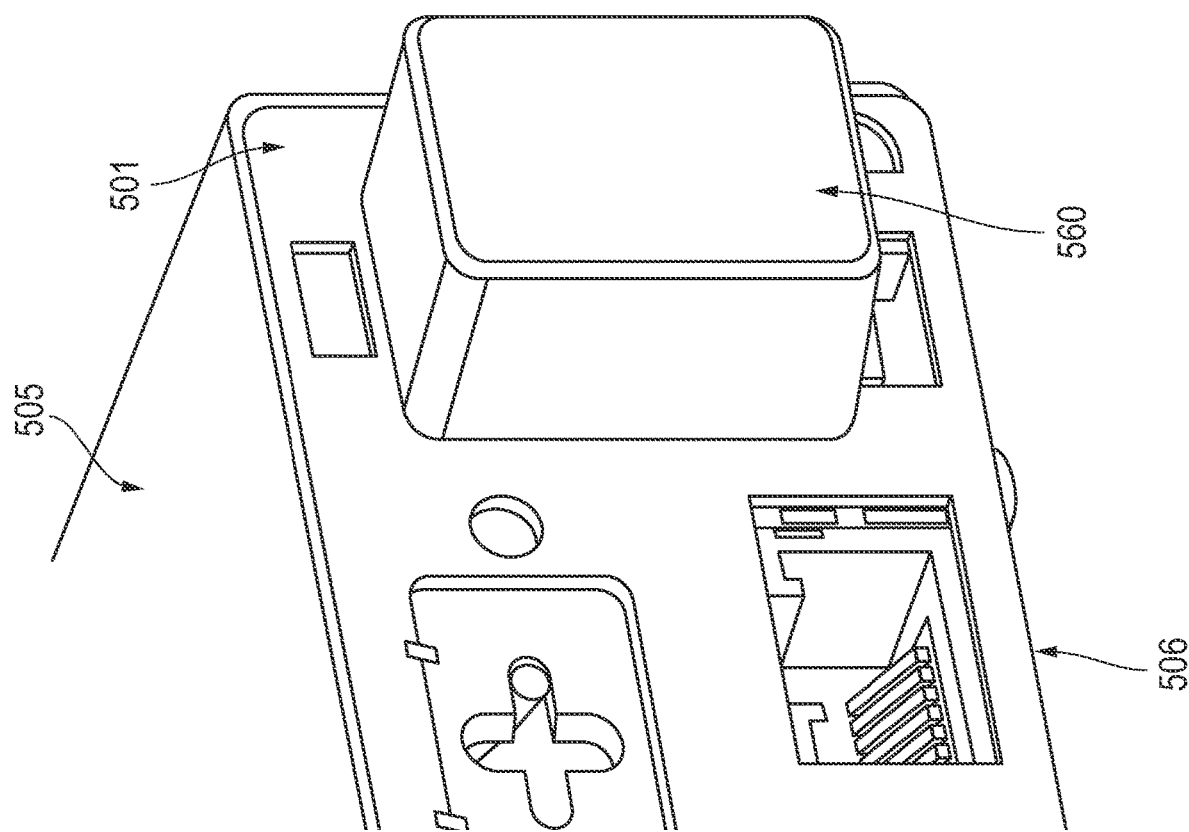
FIG. 5 is a rear view of an antenna security cover mounted to a chassis rear-wall according to an embodiment of the present disclosure.

FIG. 5 is a rear view of an antenna security cover 560 mounted to the exterior surface of an information handling system chassis rear-wall 501 according to an embodiment of the present disclosure. As described herein, in order to ensure security of the antenna, or to inhibit easy removal of the antenna during use of the information handling system by a consumer, an antenna security cover enclosing the hardwired antenna in some embodiments described herein may be securely fastened to the rear wall of the chassis. For example, an antenna security cover 560 may be affixed to a rear chassis wall 501 such that it encloses any portion of the antenna module that is exterior to the rear chassis wall 501. This may inhibit access to the antenna module from the exterior of the rear chassis wall 501. Additionally, a top cover 505 and a bottom cover 506 of the chassis may obscure access to fasteners interior to the chassis affixing the reconfigurable antenna grounding bracket to the interior of the chassis, such that the antenna module is inaccessible without removing the top chassis cover 505. As described above with respect to FIG. 2, the top cover 505 in an embodiment may be further secured to the rear wall 501 of the chassis via a K-lock or padlock inserted within an aperture of the rear chassis wall 501. Only a person in possession of the key or combination for such a K-lock or padlock in such embodiments may be capable of releasing fastening arms securing the antenna security cover 560 to the rear wall 501.

Figure 6:
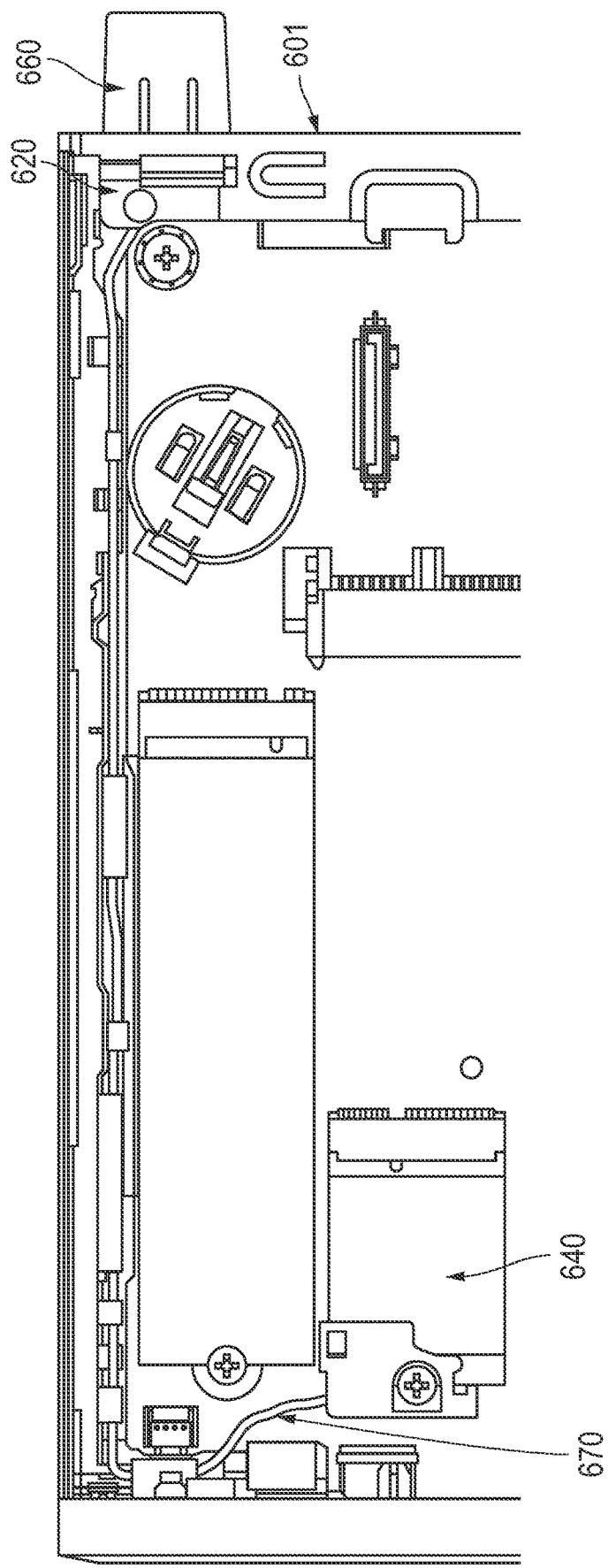
FIG. 6 is a cut-away top view of an information handling system showing antenna cable routing from a network interface device to an antenna module according to an embodiment of the present disclosure.

FIG. 6 is a cut-away top view of a reconfigurable antenna grounding bracket 620 operably connected, via an electrically conductive wire 670, to a network interface device 640 of an information handling system enclosed within a chassis according to an embodiment of the present disclosure. As described above with respect to FIGS. 3 and 4, an antenna module incorporating an antenna (e.g., PIFA or LDS) mounted to a reconfigurable antenna grounding bracket 620 may be affixed to an interior surface of the rear chassis wall 601. The grounding bracket 620 in an embodiment may be operably attached to a network interface device 640 via an electrically conductive wire 670. As also described with reference to FIG. 1, above, the network interface device 640 may include a wireless local area network (WLAN) interface device capable of transceiving data at frequencies above 6 GHz in compliance with the IEEE 802.11 ax standard referred to as Wi-Fi 6E. A security cover 660 is shown affixed to the rear wall 601 of the chassis, as described in greater detail below with respect to FIGS. 12 and 14C.

Figure 7:
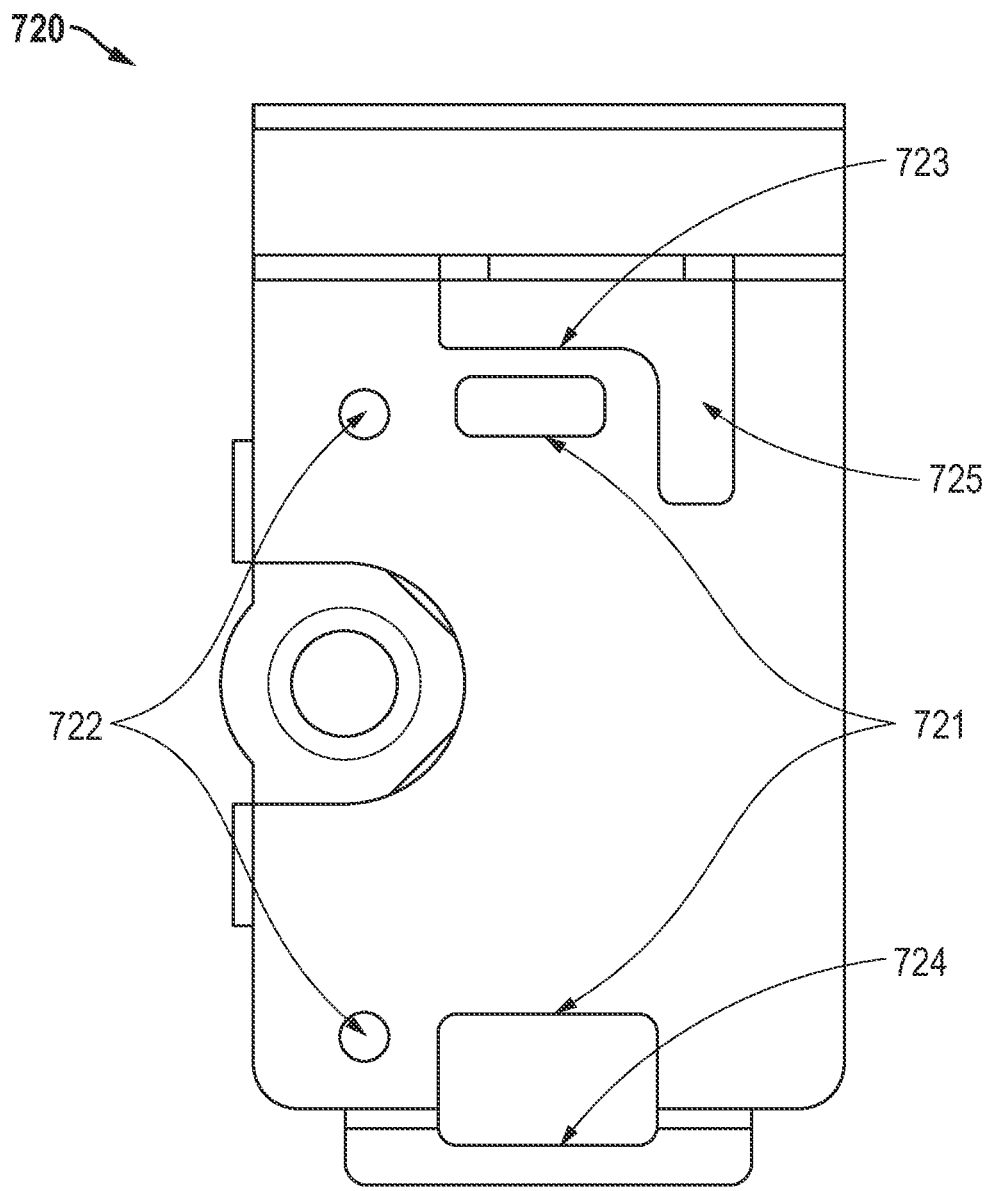
FIG. 7 is a front view of a reconfigurable antenna grounding bracket according to an embodiment of the present disclosure.

FIG. 7 is a rear view of a reconfigurable antenna grounding bracket 720 adapted for use with a hardwired antenna according to an embodiment of the present disclosure. As described herein, the antenna module may comprise a reconfigurable antenna grounding bracket 720 that is adaptable or replaceable for use with a plurality of antenna types (e.g., PIFA, LDS, SMA extendable puck). The reconfigurable antenna grounding bracket 720 in an embodiment may be comprised of any electrically conductive material capable of grounding electrical current of a transceiving antenna to the information handling chassis to which the reconfigurable antenna grounding bracket 720 may be internally mounted. The reconfigurable antenna grounding bracket 720 may include one or more design features for mounting with a rear wall of a chassis enclosing an information handling system. For example, the reconfigurable antenna grounding bracket 720 may include a bottom lip 728 for insertion within an antenna mounting insertion slot of a rear chassis wall and which may fit over the rear chassis wall at the bottom of the antenna aperture slot, as described in greater detail with respect to FIGS. 14 and 15.

The reconfigurable antenna grounding bracket 720 in an embodiment may further include one or more design features for mounting an antenna (e.g., PIFA or LDS). For example, the reconfigurable antenna grounding bracket 720 may include one or more antenna holder fastening apertures 721 through which one or more antenna holder fastening arms may be inserted to affix an antenna holder to the reconfigurable antenna grounding bracket 720, as described in greater detail with respect to FIG. 11. As another example, the reconfigurable antenna grounding bracket 720 in an embodiment may include one or more positioning pin guide holes 722 through which pin guide holes of an antenna holder may be inserted in order to ensure proper joining of the antenna holder and the reconfigurable antenna grounding bracket 720, as also described in greater detail with respect to FIG. 11. As yet another example, the reconfigurable antenna grounding bracket 720 in an embodiment may include a cable routing slot 725 through which an electrically conductive wire or cable may be inserted to operably connect a network interface device of the information handling system (e.g., as described directly above with respect to FIG. 6) to an antenna mounted to the reconfigurable antenna grounding bracket 720, and as also described in greater detail with respect to FIG. 11.

The reconfigurable antenna grounding bracket 720 in an embodiment may further include one or more design features for mounting an antenna security cover, as described in greater detail with respect to FIG. 5. For example, the reconfigurable antenna grounding bracket 720 in an embodiment may include a top security cover fastening aperture 723 through which a fastening arm of a security cover may be inserted to affix the security cover to the reconfigurable antenna grounding bracket 720, as described in greater detail with respect to FIG. 13. Fastening arms of the security cover may also be inserted within a lower one of the antenna holder fastening apertures 721 to affix the security cover to the reconfigurable antenna grounding bracket 720, as described in greater detail with respect to FIG. 13. Bottom security cover fastening aperture 724 may be the same aperture as a lower antenna holder fastening aperture 721 and accommodate both an antenna holder arm fastener and a security cover fastener arm, or a hook arm in various embodiments.

Figure 8:
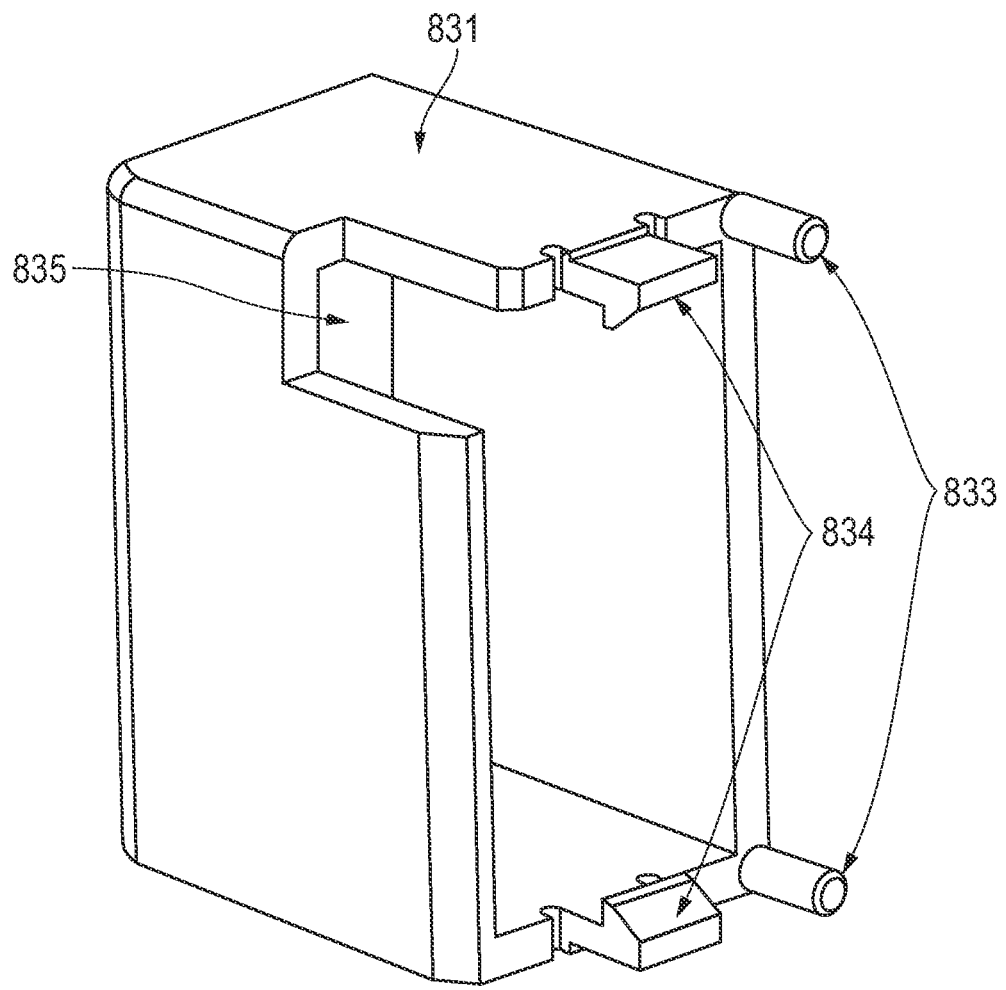
FIG. 8 is a perspective view of an antenna holder according to an embodiment of the present disclosure.

FIG. 8 is a perspective view of an antenna holder 831 adapted for use with a plurality of antenna types according to an embodiment of the present disclosure. The antenna holder 831 in an embodiment may provide a rigid or semi-rigid structure to which a metal or flexible antenna material may be adhered or etched in order to provide structural support for an antenna (e.g., PIFA, or LDS antennas). The antenna holder 831 in an embodiment may comprise any electrically non-conductive, radiofrequency transparent material, such as, for example, several types of plastics, and may include five full or partial walls. One side of the antenna holder 831 may be open in order to form a shell in some embodiments. In other embodiments, the antenna holder 831 may comprise a fewer or greater number of walls, and may take on many shapes, other than an elongated cube as shown in FIG. 8. It is contemplated that the antenna holder 831 in an embodiment may take on any three-dimensional shape capable of providing structural support to an antenna etched or mounted thereto.

A cable attachment slot 835 may be disposed through a portion of the antenna holder 831 in order to provide a channel through which an electrically conductive wire or cable may be inserted for operable connection to an antenna mounted onto, adhered to, or etched into the antenna holder 831, as described in greater detail with respect to FIGS. 9 and 10, below. The antenna holder 831 in an embodiment may further comprise one or more positioning pins 833 protruding from a surface of the antenna holder 831 to which a reconfigurable antenna grounding bracket may be mounted or affixed. The antenna holder 831 in an embodiment may further comprise one or more antenna holder fastening arms 834 protruding from a surface of the antenna holder 831 to which a reconfigurable antenna grounding bracket may be mounted or affixed. Both the antenna holder fastenings arms 834 and the positioning pins 833 in an embodiment may assist in mating of the antenna holder 831 to a reconfigurable antenna grounding bracket, as described in greater detail with respect to FIG. 11, below. As described below, the antenna holder 831 in an embodiment may be adaptable for use with one of a variety of different types of antennas.

Figure 9:
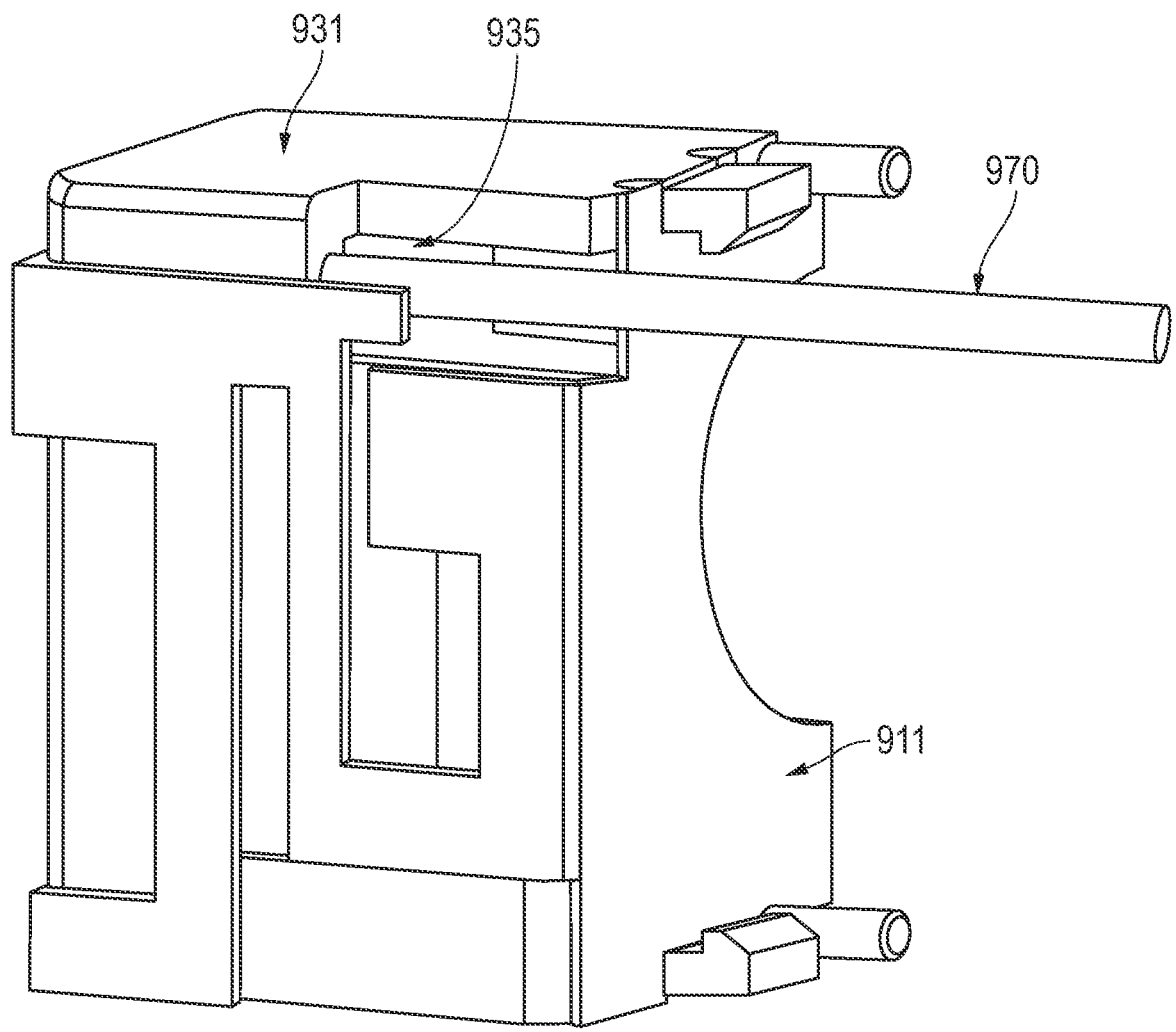
FIG. 9 is a perspective view of a Planar Inverted F-Antenna (PIFA) mounted to an antenna holder according to an embodiment of the present disclosure.

FIG. 9 is a perspective view of a PIFA antenna mounted to an antenna holder and operably connected to an electrically conductive wire according to an embodiment of the present disclosure. As described herein, the antenna holder 931 in an embodiment may provide a rigid or semi-rigid structure to which a metal or flexible antenna material may be adhered or etched in order to provide structural support for a PIFA antenna 911. In an embodiment, the PIFA antenna 911 may be affixed to the antenna holder 931 through a variety of means, including adhesives, brackets, clamps, or other mechanical means. PIFA antenna 911 may also be etched, such as with an etched conductor (e.g., copper) layer, on antenna holder 931 side wall as described further in FIG. 10. An electrically conductive wire 970 in an embodiment may be inserted through a cable attachment slot 935 disposed through a portion of the antenna holder 931, and operably coupled to the PIFA antenna 911. In such a way, the antenna holder 931 may be adapted for use with the PIFA antenna 911.

Figure 10:
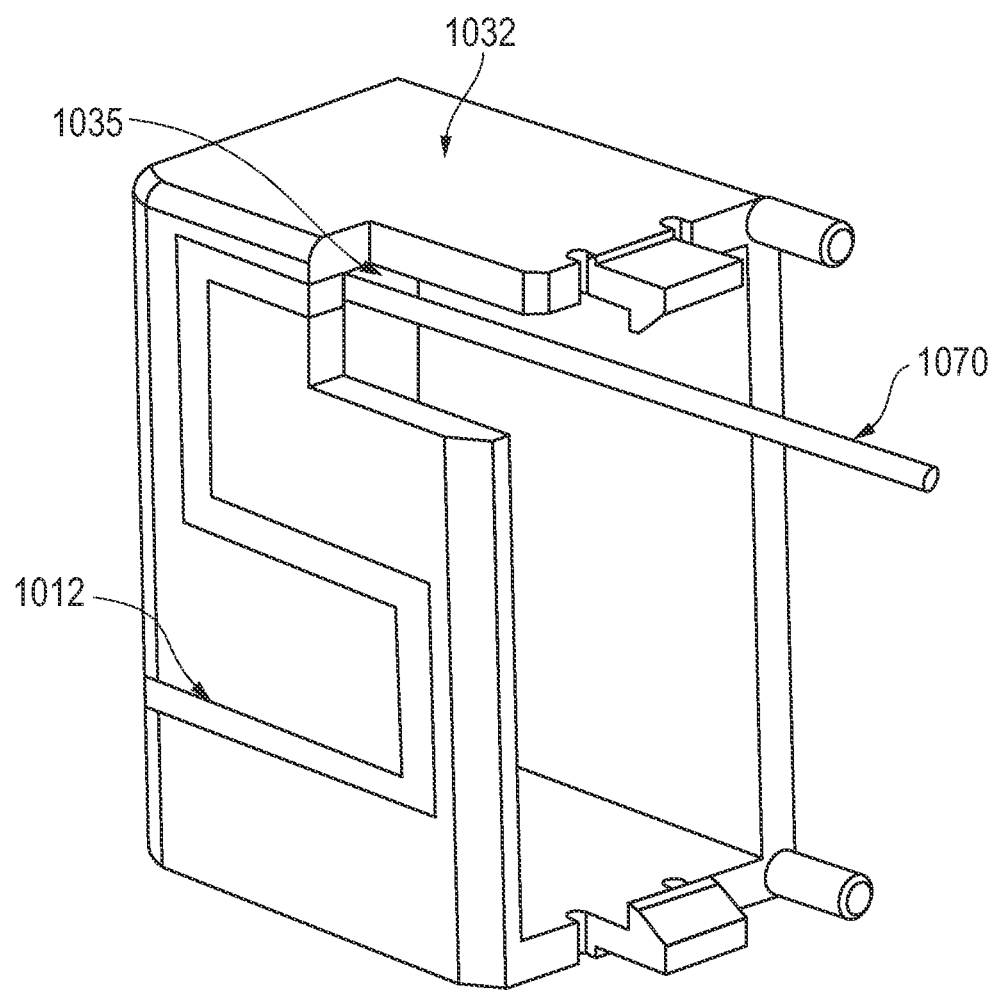
FIG. 10 is a perspective view of a Laser Direct Structure (LDS) antenna etched into an external surface of an antenna holder according to an embodiment of the present disclosure.

FIG. 10 is a perspective view of an LDS antenna etched into an external surface of an antenna holder and operably connected to an electrically conductive wire according to an embodiment of the present disclosure. As described herein, the antenna holder 1032 in an embodiment may provide a rigid or semi-rigid structure to which a metal or flexible antenna material may be adhered or etched in order to provide structural support for an LDS antenna 1012. In an embodiment, a channel may be etched partially through the thickness of one or more walls of the antenna holder 1032 in the pattern of an antenna such as PIFA, dipole, or any other antenna design, then filled with an electrically conductive material (e.g., copper, bronze, silver, gold) to form an LDS antenna 1012. An electrically conductive wire 1070 in an embodiment may be inserted through a cable attachment slot 1035 disposed through a portion of the antenna holder 1031, and operably coupled to the LDS antenna 1012. In such a way, the antenna holder 1032 may be adapted for use with the LDS antenna 1012.

Figure 11:
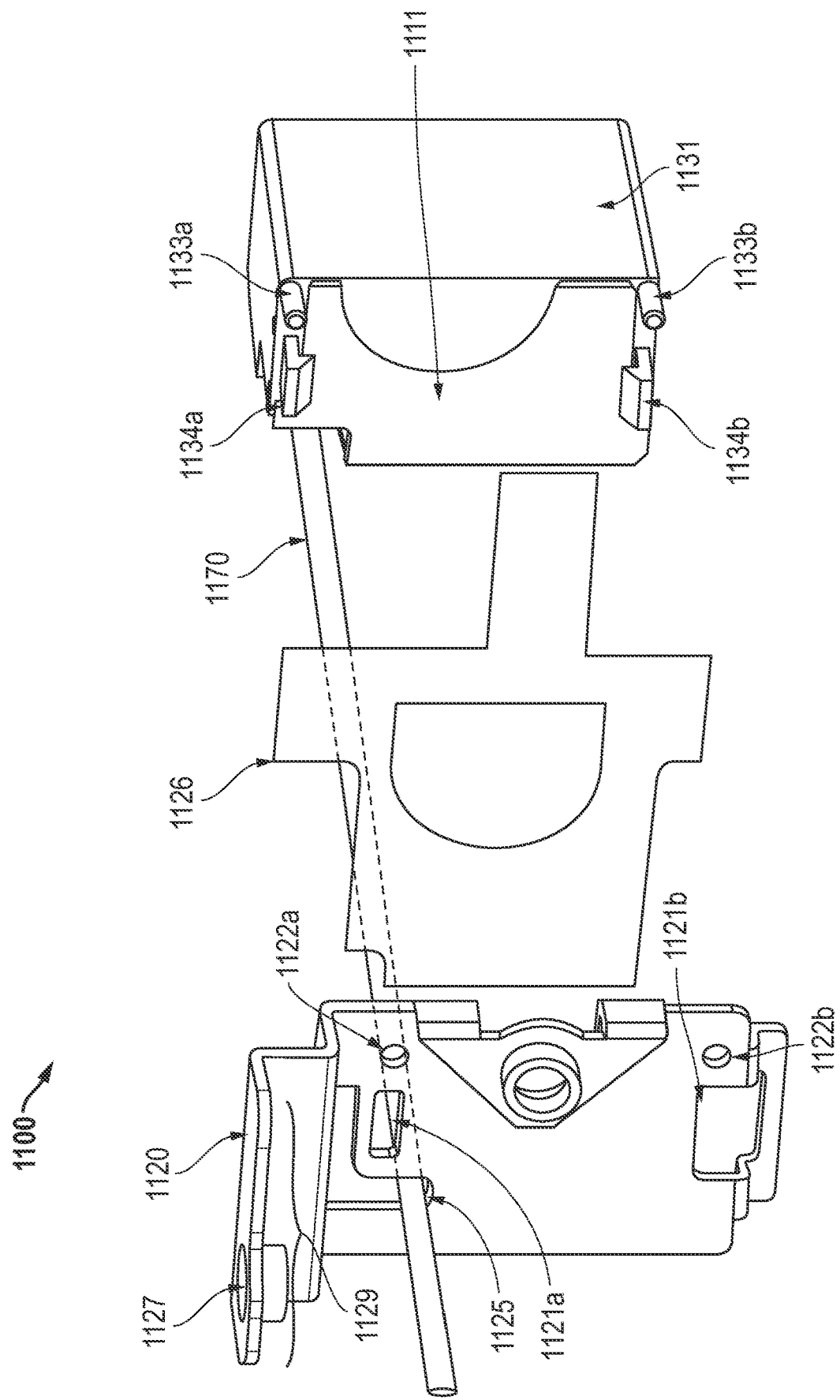
FIG. 11 is an exploded perspective view of assembly components for an antenna module according to an embodiment of the present disclosure.

FIG. 11 is an exploded perspective view of assembly components for an antenna module 1100, including a reconfigurable antenna grounding bracket 1120 and an antenna holder 1131 mounted to a hardwired antenna according to an embodiment of the present disclosure. As described herein, an antenna module 1100 in an embodiment may be configured to incorporate several different types of antennas (e.g., PIFA antenna 1111, or LDS antenna or a variety of other forms described above with reference to FIG. 10) for mounting to the exterior rear wall of an information handling system chassis through a re-purposed SMA adapter port already included within previous chassis designs. Such an antenna module may be assembled in various embodiments by operably connecting one of a variety of different types of antennas (e.g., PIFA 1111, LDS antenna described above with reference to FIG. 10 or extendable puck antenna) to the network interface device of the information handling system and to a reconfigurable antenna grounding bracket 1120. In an embodiment, the reconfigurable antenna grounding bracket 1120 may be adaptable for use with each of the variety of antennas (e.g., as described above with reference to FIG. 7), and may be configured for mounting internally within the chassis. For example, the reconfigurable antenna grounding bracket 1120 may include a top lip extending from the front surface of the reconfigurable antenna grounding bracket 1120 that forms an internal mounting portion 1129. In an embodiment, this internal mounting portion 1129 may include an internal bracket fastener hole 1127 disposed throughout the thickness of the internal mounting portion 1129 for insertion of an internal fastener. As described in greater detail with respect to FIGS. 14A and 14B below, the internal mounting portion 1129 may be mounted directly beneath a portion of the chassis, and affixed to the chassis via an internal fastener inserted through the portion of the chassis directly under which the internal mounting portion 1129 has been disposed, and through the internal bracket fastener hole 1127 of the internal mounting portion 1129.

An electrically conductive wire 1170 in an embodiment may be operably connected to a network interface device of the information handling system enclosed within the chassis (as described with respect to FIG. 6, above. In an embodiment, the wire or cable 1170 may be disposed through a cable routing slot 1125 of the reconfigurable antenna bracket 1120, and inserted into a cable attachment slot of an antenna holder 1131 (e.g., as described in greater detail above with respect to FIGS. 9 and 10). The electrically conductive wire or cable 1170 in such an embodiment may further be operably coupled to an antenna mounted to the antenna holder 1131. As described herein, the antenna holder 1131 may be modified in use with various different types of antennas. Thus, although FIG. 11 depicts use of a PIFA antenna 1111 operably connected to the electrically conductive wire 1170 and mounted to the antenna holder 1131, other embodiments contemplate use of other types of antennas, including the LDS antenna or a variety of forms described in greater detail above with respect to FIG. 10.

A layer of aluminum or other metal foil 1126 in an embodiment may be disposed between the PIFA antenna 1111 or the antenna holder 1131 and the reconfigurable antenna bracket 1120. The aluminum foil 1126 in an embodiment may be shaped to allow for passage of the electrically conductive wire around the edges of the aluminum foil 1126, and toward the antenna holder 1131. In an embodiment, the aluminum foil 1126 may further be shaped to allow for insertion of various structures (e.g., 1133a, 1133b, 1134a, and 1134b) within various apertures (e.g., 1121, 1122a, 1122b) of the reconfigurable antenna grounding bracket 1120 during a mounting process, as described directly below. One or more guide pins (e.g., 1133a and 1133b) in an embodiment may be inserted within one or more positioning pin guide holes (e.g., 1122a and 1122b) to ensure proper placement of the antenna holder 1131 with respect to the reconfigurable antenna grounding bracket 1120.

As described herein, the antenna (e.g., PIFA 1111) may be housed within an antenna holder 1131 secured to the reconfigurable antenna grounding bracket 1120 via one or more antenna holder fastening arms (e.g., 1134a and 1134b). The antenna holder fastening arms 1134a and 1134b in an embodiment may be comprised of any non-conductive, radiofrequency transparent material that is deformable under pressure. As shown in FIG. 11, the upper antenna holder fastening arm 1134a in an embodiment may take the form of a deformable snap structure that deforms slightly upward when pressure is placed on the rear surface of the antenna holder 1131 to assist in insertion of the upper antenna holder fastening arm 1134a into the upper antenna holder fastening aperture 1121a. Upon full insertion of a bottom lip of the upper antenna holder fastening arm 1134a through the upper antenna holder fastening aperture 1121a in such a way, the deformable antenna holder fastening arm 1134a may return to its original shape, causing the lower lip of the upper antenna holder fastening arm 1134a to snap into place just below the upper antenna holder fastening aperture 1121 on the front face of the reconfigurable antenna mounting bracket 1121a, as described in greater detail below with respect to FIG. 13. Such a deformable snap is only one example embodiment of a fastening arm. It is contemplated that any fastening means known in the art may be used in order to secure components of an antenna assembly to one another, or to secure any portion of an antenna assembly to any portion of an information handling system chassis. For example, other embodiments contemplate the use of screws, adhesives, magnets, electromagnets, clips, or ties. The lower antenna holder fastening arm 1134b in an embodiment may take the form of a deformable snap structure that deforms slightly downward when pressure is placed on the rear surface of the antenna holder 1131 to assist in insertion of the lower antenna holder fastening arm 1134b into the lower antenna holder fastening aperture 1121b. Upon full insertion of a top lip of the lower antenna holder fastening arm 1134b through the lower antenna holder fastening aperture 1121b in such a way, the deformable lower antenna holder fastening arm 1134b may return to its original shape, causing the upper lip of the lower antenna holder fastening arm 1134b to snap into place just above the lower antenna holder fastening aperture 1121 on the front face of the reconfigurable antenna mounting bracket 1121b, as described in greater detail below with respect to FIG. 13. The reconfigurable antenna grounding bracket 1320, when mounted to the antenna holder 1131 and antenna 1111 may form an antenna module 1100.

Figure 12:
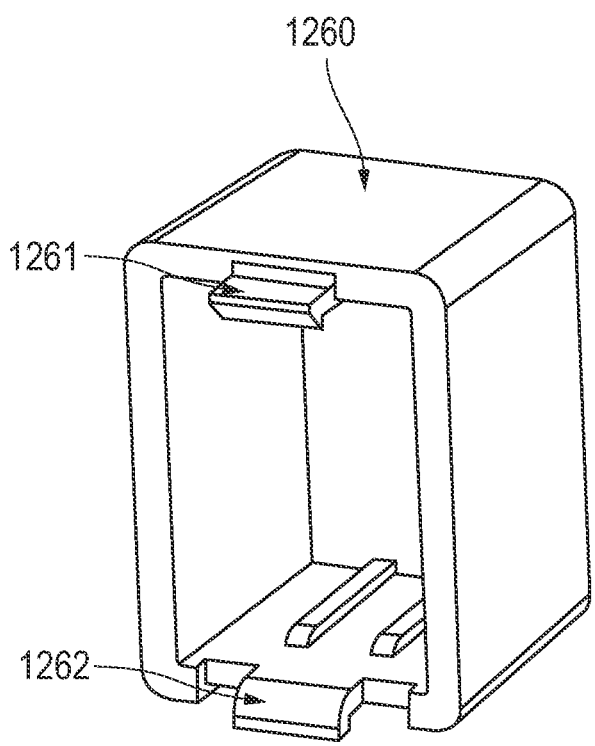
FIG. 12 is a perspective view of an antenna security cover according to an embodiment of the present disclosure.

FIG. 12 is a perspective view of an antenna security cover 1260 for housing and securing a plurality of hardwired antenna types according to an embodiment of the present disclosure. As described herein, in order to ensure security of an antenna operably connected to the information handling system enclosed within the chassis and mounted within an antenna assembly (e.g., as described with respect to FIG. 11, above), or to inhibit easy removal of the antenna during use of the information handling system by a consumer, an antenna security cover 1260 enclosing the antenna and antenna holder may be securely fastened to the rear wall of the chassis.

The antenna security cover 1260 in an embodiment may be comprised of any electrically non-conductive, radiofrequency transparent material, including several types of plastics. In an embodiment, the antenna security cover 1260 may be fastened to the rear wall of the chassis via one or more security cover fastening arms (e.g., 1261 or 1262) of the antenna security cover 1260 being disposed through security cover apertures formed within the reconfigurable antenna grounding bracket mechanically mounted to the interior of the chassis or formed in a backwall of the chassis, as described with reference to FIG. 13, below. Security cover fastening arms 1261 or 1262 may be one or more deformable clip structures, such as shown in 1261 or may include a hook-shaped fastening arm shown as 1262 to engage with an edge of the security cover aperture.

Figure 13:
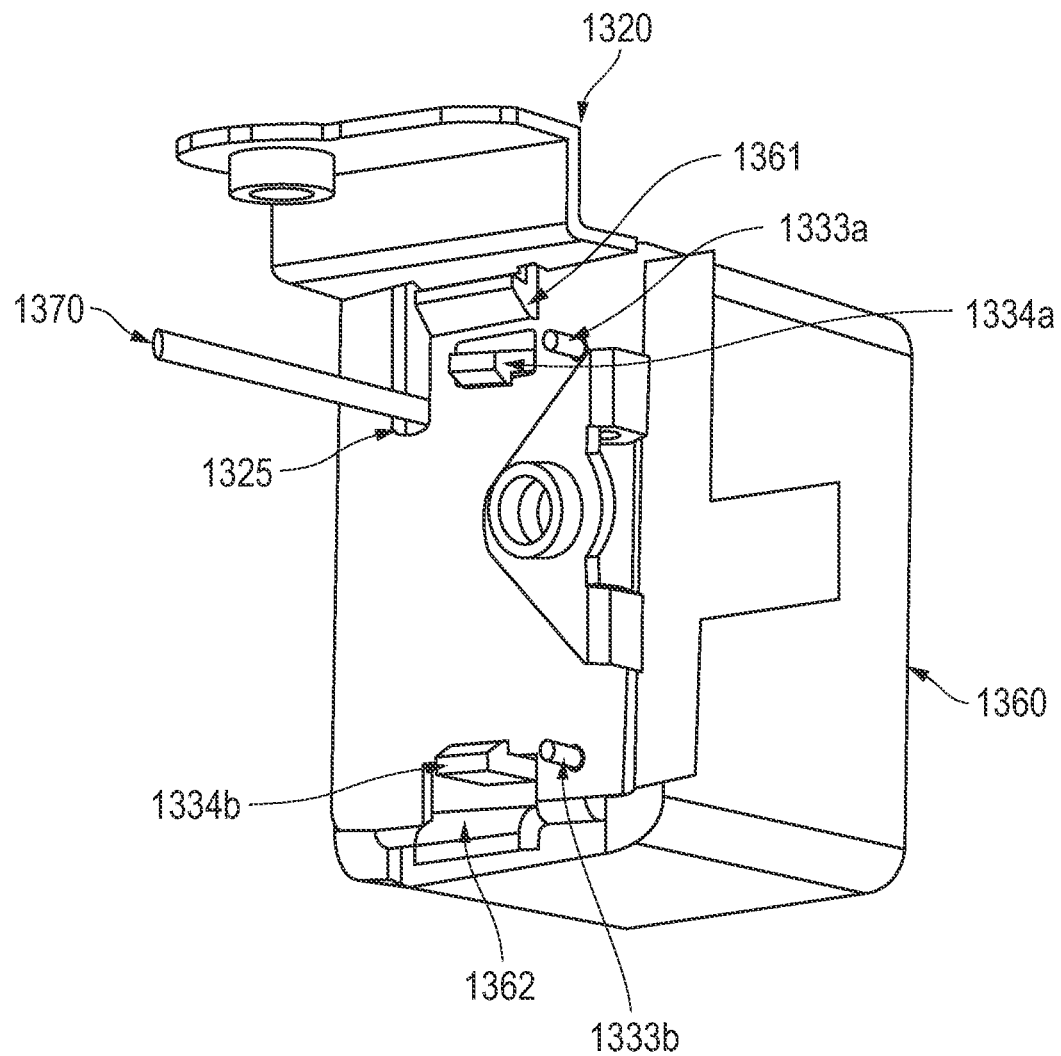
FIG. 13 is a perspective view of an antenna module and attached security cover according to an embodiment of the present disclosure.

FIG. 13 is a perspective view of an antenna module incorporating a hardwired antenna and attached security cover according to an embodiment of the present disclosure. As described above with respect to FIG. 11, the reconfigurable antenna grounding bracket 1320, when mounted to the antenna holder and antenna may form an antenna module. In an embodiment, the antenna module may be operably coupled to a network interface device of the information handling system via an electrically conductive wire or cable 1370, routed through a cable routing slot 1325 of the reconfigurable antenna grounding bracket 1320. The antenna in an embodiment may be housed within an antenna holder comprising one or more guide pins (e.g., 1333*a* and 1333*b*). The top guide pin 1333*a* may ensure proper placement of the antenna holder with respect to the reconfigurable antenna grounding bracket 1320 during mounting of the two structures together through insertion of the top guide pin 1333*a* through an upper guide pin hole of the reconfigurable antenna grounding bracket 1320. In another example, the bottom guide pin 1333*b* may ensure proper placement of the antenna holder with respect to the reconfigurable antenna grounding bracket 1320 during mounting of the two structures together through insertion of the bottom guide pin 1333*b* through a lower guide pin hole of the reconfigurable antenna grounding bracket 1320.

The antenna holder may then be secured to the reconfigurable antenna grounding bracket 1320 via one or more antenna holder fastening arms (e.g., 1334*a* and 1334*b*). The upper antenna holder fastening arm 1334*a* in an embodiment may take the form of a deformable snap structure that deforms slightly upward to assist in insertion of the upper antenna holder fastening arm 1334*a* into the upper antenna holder fastening aperture of the reconfigurable antenna grounding bracket 1320. Upon full insertion of a bottom lip of the upper antenna holder fastening arm 1334*a* through the upper antenna holder fastening aperture of the reconfigurable antenna grounding bracket 1320 in such a way, the deformable antenna holder fastening arm 1334*a* may return to its original shape, causing the lower lip of the upper antenna holder fastening arm 1334*a* to snap into place just below the upper antenna holder fastening aperture on the front face of the reconfigurable antenna mounting bracket 1320, locking the antenna holder into place against the rear surface of the reconfigurable antenna grounding bracket 1320.

The lower antenna holder fastening arm 1334*b* in an embodiment may take the form of a deformable snap structure that deforms slightly downward to assist in insertion of the lower antenna holder fastening arm 1334*b* into the lower antenna holder fastening aperture of the reconfigurable antenna grounding bracket 1320. Upon full insertion of a top lip of the lower antenna holder fastening arm 1334*b* through the lower antenna holder fastening aperture of the reconfigurable antenna grounding bracket 1320 in such a way, the deformable lower antenna holder fastening arm 1334*b* may return to its original shape, causing the upper lip of the lower antenna holder fastening arm 1334*b* to snap into place just above the lower antenna holder fastening aperture on the front face of the reconfigurable antenna mounting bracket 1320, locking the antenna holder into place against the rear surface of the reconfigurable antenna grounding bracket 1320.

The antenna security cover 1360 in an embodiment may also be mounted to the reconfigurable antenna grounding bracket 1320 by one or more security cover fastening arms (e.g., 1361 and 1362) so as to enclose the antenna holder, as shown in FIG. 13. For example, the upper security cover fastening arm 1361 in an embodiment may take the form of a deformable snap structure that deforms slightly upward when pressure is placed on the rear surface of the security cover 1360 to assist in insertion of the upper security cover fastening arm 1361 into the upper security cover fastening aperture of the reconfigurable antenna grounding bracket 1320 or, in some embodiments, in the rear chassis wall. Upon full insertion of a bottom lip of the upper security cover fastening arm 1361 through the upper security cover fastening aperture of the reconfigurable antenna grounding bracket 1320 in such a way, the deformable security cover fastening arm 1361 may return to its original shape, causing the lower lip of the upper security cover fastening arm 1361 to snap into place just below the upper security cover fastening aperture on the front face of the reconfigurable antenna mounting bracket 1320, or in some embodiments, in the rear chassis wall.

As another example, the lower security cover fastening arm 1362 in an embodiment may take the form of a deformable snap structure that deforms slightly downward when pressure is placed on the rear surface of the security cover 1360 to assist in insertion of the lower security cover fastening arm 1362 into the lower security cover fastening aperture of the reconfigurable antenna grounding bracket 1320. Upon full insertion of a top lip of the lower security cover fastening arm 1362 through the lower security cover fastening aperture of the reconfigurable antenna grounding bracket 1320 or rear chassis wall in such a way, the deformable security cover fastening arm 1362 may return to its original shape, causing the upper lip of the lower security cover fastening arm 1362 to snap into place just above the lower security cover fastening aperture on the front face of the reconfigurable antenna mounting bracket 1320 or rear chassis wall.

However, as shown in FIG. 13, lower security cover fastener arm 1362 is a hook structure that engages the edge of the lower security cover fastening aperture while the upper security cover fastener arm 1361 is the deformable snap structure described above. In other embodiments, 1361 and 1362 may be switched with the deformable snap structure as the lower security cover fastener arm 1362 and a hook structure as the upper security cover fastener arm 1361. In still other embodiments, 1361 and 1362 may both be deformable snap structures. FIG. 13 depicts affixing or mounting of the security cover 1360 to the reconfigurable antenna grounding bracket 1320 prior to insertion of the antenna module (e.g., including the reconfigurable antenna grounding bracket 1320 and the antenna holder) within the chassis. In another embodiment, the security cover 1360 to the reconfigurable antenna grounding bracket 1320 after insertion of the antenna module within the chassis, as described directly below with respect to FIGS. 14A, 14B, and 14C.

Figure 14A:
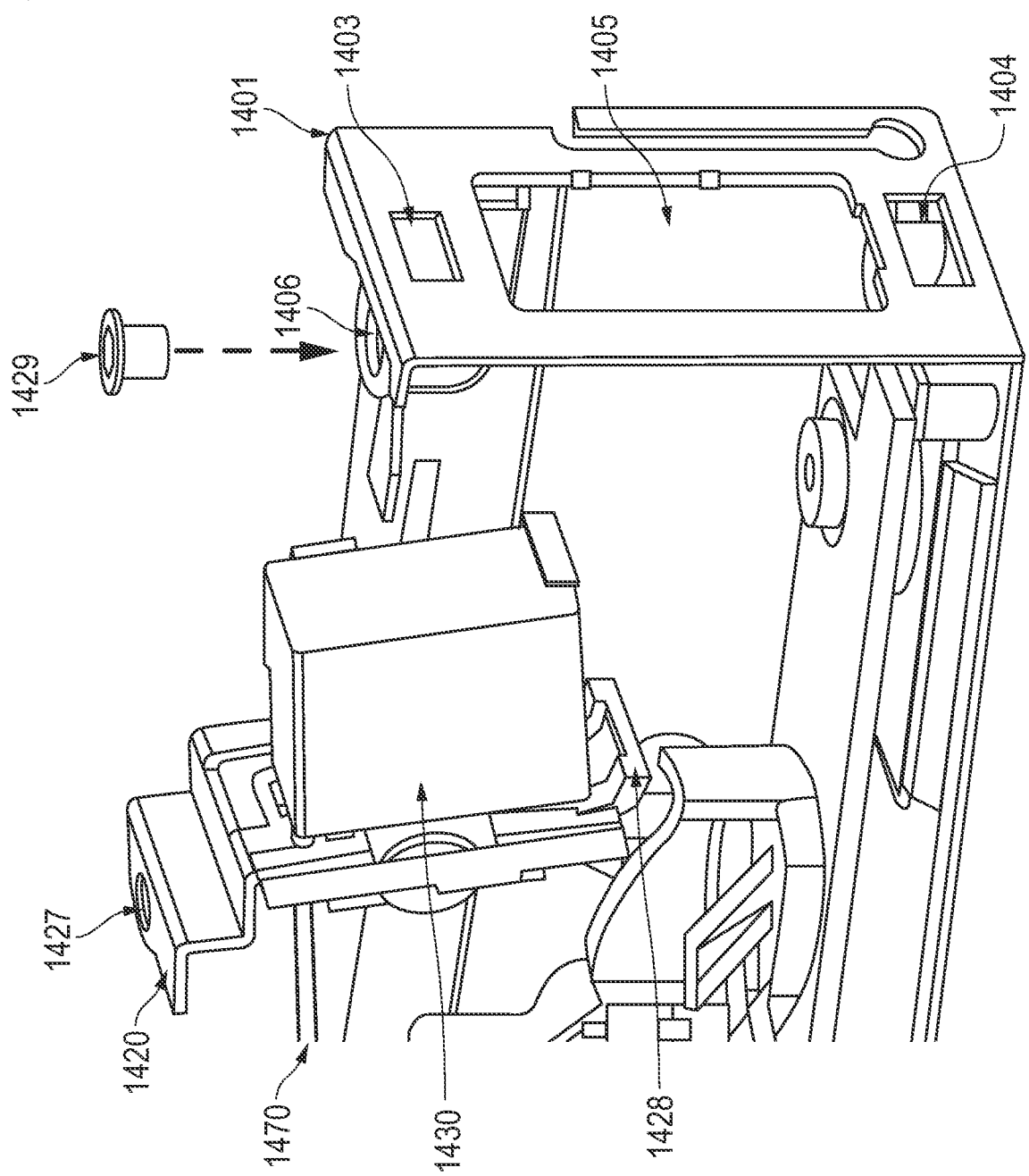
FIG. 14A is a cut-away view of an antenna module being partially inserted through an antenna mounting slot of a chassis rear wall according to an embodiment of the present disclosure.

FIG. 14A is a cut-away view of an antenna module being partially inserted through an antenna mounting slot disposed through the rear wall of an information handling system chassis according to an embodiment of the present disclosure. The antenna module that includes the reconfigurable antenna grounding bracket 1420, the electrically conductive wire 1470, and the antenna holder 1430 in an embodiment may be inserted through an antenna mounting insertion slot 1405 disposed through the chassis rear wall 1401. In an embodiment, the reconfigurable antenna module may be inserted in such a way, from the interior of the chassis, such that the majority of the antenna grounding bracket 1420 remains on the interior side of the chassis rear wall 1401. The reconfigurable antenna grounding bracket bottom lip 1428 in an embodiment may be inserted through the antenna mounting insertion slot 1405, such that the reconfigurable antenna grounding bracket bottom lip 1428 hooks over the exterior bottom edge of the antenna mounting insertion slot 1405. In such a way, the remainder of the reconfigurable antenna bracket 1420 disposed on the interior surface of the rear chassis wall 1401 may be maneuvered for fastening with the rear wall 1401 of the chassis. For example, a bracket internal fastener 1429, such as a screw, bolt, or other fastening mechanism may be inserted through an internal bracket fastener hole 1427 of the reconfigurable antenna grounding bracket 1420, and through an internal chassis fastener hole 1406 of the chassis. In such a way, the internal fastener may secure the antenna module in place with respect to the chassis rear wall 1401, and may only be accessible from the interior of the chassis.

Figure 14B:
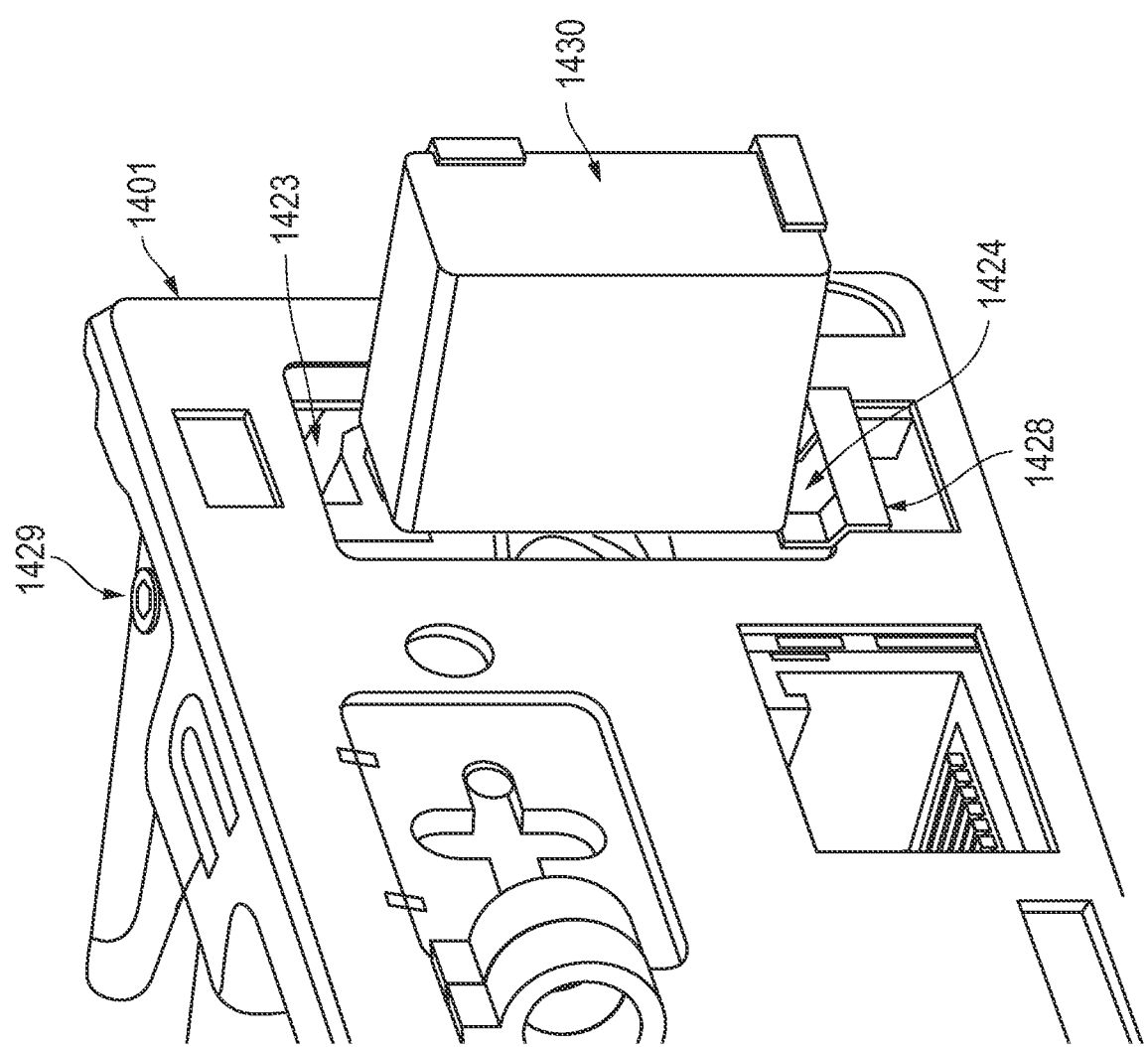
FIG. 14B is a cut-away view of a reconfigurable antenna grounding bracket mounted within a chassis according to an embodiment of the present disclosure.

FIG. 14B is a cut-away view of a reconfigurable antenna grounding bracket of an antenna module mounted internally within an information handling system chassis according to an embodiment of the present disclosure. As described herein, the reconfigurable antenna grounding bracket bottom lip 1428 in an embodiment may be inserted through the antenna mounting insertion slot, such that the reconfigurable antenna grounding bracket bottom lip 1428 hooks over the exterior bottom edge of the antenna mounting insertion slot. The bracket internal fastener 1429 may secure the antenna module, including the antenna holder 1430 in place with respect to the chassis rear wall 1401, and may only be accessible from the interior of the chassis. As described herein, an antenna security cover (not shown) in an embodiment may also be mounted to the reconfigurable antenna grounding bracket by one or more security cover fastening arms inserted through the upper security cover fastening aperture 1423 and lower security cover fastening aperture 1424 within the reconfigurable antenna grounding bracket, or optionally in the rear chassis wall 1401, as also described in greater detail above with respect to FIG. 13 and below with respect to FIG. 14C. Because the reconfigurable antenna grounding bracket is mounted internally within the chassis, any fastening arms inserted through apertures within the reconfigurable antenna grounding bracket may only be accessed from the interior of the rear chassis wall 1401. This may include one or more antenna holder fastening arms mounting the antenna holder and antenna to the reconfigurable antenna grounding bracket and one or more security cover fastening arms mounting the security cover to the rear chassis so as to enclose the antenna and antenna holder. Thus, the security cover, antenna, and antenna holder may be removed or separated from the rear chassis 1401 in an embodiment only by accessing the interior side of the chassis rear wall 1401.

FIG. 14C is a cut-away view of an antenna security cover affixed to an exterior surface of a chassis rear wall to inhibit access to an antenna module partially housed therewithin according to an embodiment of the present disclosure. As described herein, an antenna security cover 1460 in an embodiment may also be mounted to the chassis rear wall 1401 by one or more security cover fastening arms inserted through one or more security cover fastening apertures within the reconfigurable antenna grounding bracket, or in the rear chassis wall 1401. The security cover 1460 may be situated such that it encloses any portion of the antenna module situated on the exterior of the rear chassis wall 1401, including the antenna and the antenna holder, following mounting of the reconfigurable antenna grounding bracket within the interior of the chassis, as described directly above with respect to FIG. 14B.

The security cover 1460 may inhibit access to the antenna and antenna holder from the exterior of the chassis. Further, because the reconfigurable antenna grounding bracket is mounted internally within the chassis, any fastening arms inserted through apertures within the reconfigurable antenna grounding bracket or rear chassis wall 1401 may only be accessed from the interior of the rear chassis wall 1401. This may include one or more antenna holder fastening arms mounting the antenna holder and antenna to the reconfigurable antenna grounding bracket and one or more security cover fastening arms mounting the security cover 1460 to the rear chassis wall 1401 so as to enclose the antenna and antenna holder. Thus, the security cover 1460, antenna, and antenna holder may be removed or separated from the rear chassis 1401 in an embodiment only by accessing the interior side of the chassis rear wall 1401.

In addition, a top cover may be joined to the rear wall 1401 so as to inhibit access to the internal fastener 1429 mounting the reconfigurable antenna grounding bracket to the interior surface of the chassis rear wall 1401. For example, as described above with respect to FIG. 5, above, a top cover 505 may be joined with the rear chassis wall 501 to inhibit access to such an internal fastener. In such a way, the security cover 1460 in an embodiment may enclose and secure the portion of the antenna module exterior to the chassis rear wall 1410 and may be removed only by internal access to the chassis rear wall 1401. As described above with respect to FIG. 5, a top cover 505 in an embodiment may be further secured to the rear wall 501 of the chassis via a K-lock or padlock inserted within an aperture of the rear chassis wall 501. Only a person in possession of the key or combination for such a K-lock or padlock in such embodiments may be capable of releasing the fastening arms (e.g., 1261 or 1262 described with reference to FIG. 12, or 1361 and 1362 described with respect to FIG. 13) securing the antenna security cover 560 to the rear chassis wall 501.

Figure 15:
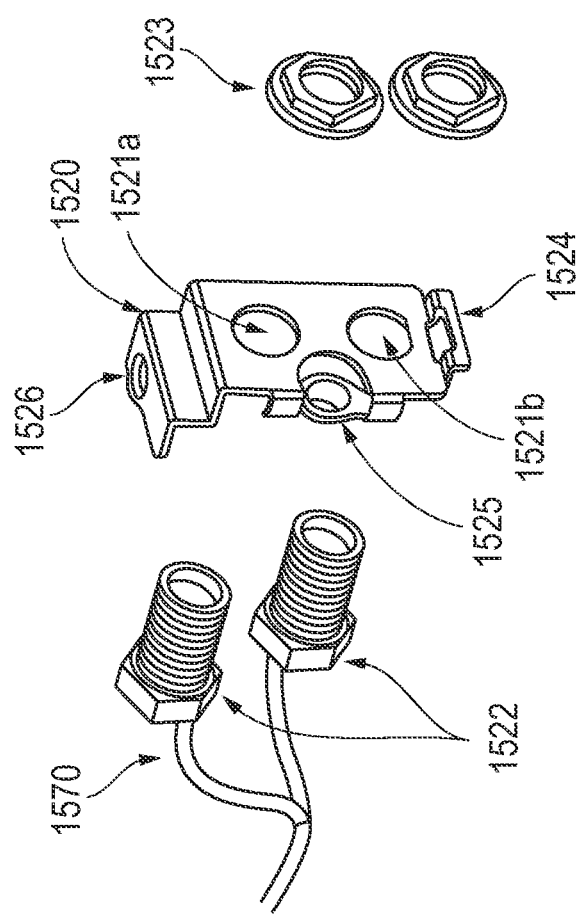
FIG. 15 is an exploded perspective view of a reconfigurable antenna grounding bracket and components for an antenna module mounted to an information handling system chassis rear wall according to an embodiment of the present disclosure.

FIG. 15 is a perspective view of an antenna module including a reconfigurable antenna grounding bracket and two SMA adapters configured to mount to an information handling system chassis rear wall according to a third embodiment of the present disclosure. As described herein, the reconfigurable antenna grounding bracket 1520 may be adaptable or replaceable in various embodiments for use with each of a variety of antennas. FIG. 15 describes example embodiments in which an antenna (e.g., extendable puck antenna transceiving data within the Wi-Fi 6E 6 GHz frequency spectrum) is operably connected to the network interface device of the information handling system enclosed within the chassis via one or more SMA adapters 1522. Such an antenna, operably connected via one or more SMA adapters 1522 in an embodiment may be referred to herein as "SMA antennas." The reconfigurable antenna grounding bracket 1520 in an embodiment may be adapted for use with SMA antennas by machining one or more SMA adapter apertures (e.g., 1521*a* and 1521*b*) through the reconfigurable antenna grounding bracket 1520, to allow for insertion of the SMA adapters 1522 through the reconfigurable antenna grounding bracket 1520. The SMA adapters 1522 in an embodiment may be operatively coupled to the network interface device of an information handling system disposed within the chassis via one or more electrically conductive wires or cables 1570, for example. Upon insertion of the SMA adapters 1522 within the SMA adapter apertures 1521*a* or 1521*b*, one or more SMA adapter nuts 1523 may be screwed into place around the base of the adapters 1522 to fix them into place with respect to the reconfigurable antenna grounding bracket 1520. In an embodiment, the reconfigurable antenna grounding bracket 1520 may further incorporate a bracket internal fastener aperture 1526 and a lower lip 1524, both of which facilitate mounting of the reconfigurable antenna grounding bracket 1520 within the interior of the chassis rear wall, as described in greater detail with respect to FIGS. 17A and 17B. The reconfigurable antenna grounding bracket 1520 in an embodiment may further include a bracket external fastener aperture 1525 through which a fastener, such as a screw may be inserted to secure an antenna security cover to the reconfigurable antenna grounding bracket, as described in greater detail below with respect to FIG. 16.

Figure 16:
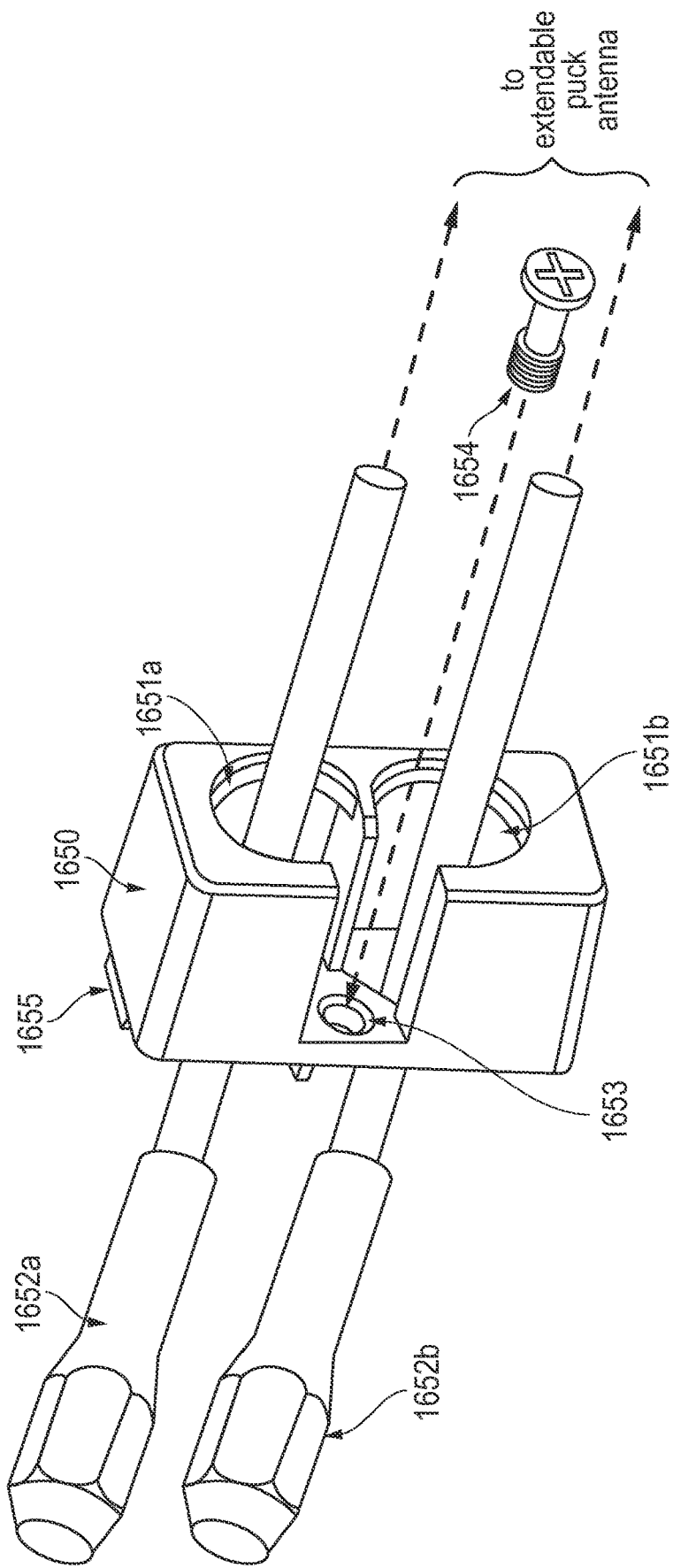
FIG. 16 is an exploded perspective view of a Sub-Miniature Version A (SMA) cable security cover for an external antenna module according to an embodiment of the present disclosure.

FIG. 16 is an exploded perspective view of assembly components for an SMA antenna module, including a reconfigurable antenna grounding bracket adapted for use with SMA adapters according to an embodiment of the present disclosure. As described herein, in order to ensure security of the antenna, or to inhibit easy removal of the antenna during use of the information handling system, an antenna security cover 1650 enclosing the antenna portion of the antenna assembly in embodiments described herein may be securely fastened to the rear wall of the chassis. For example, in an embodiment employing SMA adapters within the antenna portion, as described directly above with respect to FIG. 15, an SMA antenna security cover 1650 may inhibit access to SMA adapters of an extendable puck antenna that are operably connected to the SMA adapters affixed to the rear wall of the chassis.

The SMA antenna security cover 1650 in an embodiment may be comprised of any electrically non-conductive, radiofrequency transparent material, including several types of plastics. In an embodiment, the SMA antenna security cover 1560 may be fastened to the rear wall of the chassis via one or more security cover fastening arms (e.g., 1655) of the SMA antenna security cover 1650 being disposed through security cover apertures formed within the reconfigurable antenna grounding bracket mechanically mounted to the interior of the chassis, or being disposed through security cover apertures formed within the rear chassis wall, as described with reference to FIG. 17C, below. The SMA antenna security cover 1650 in an embodiment may further comprise one or more SMA adapter security cover apertures (e.g., 1651*a*, or 1651*b*), and an SMA security cover external fastener aperture 1653 facilitating external fastening of the SMA security cover 1650 to the rear chassis wall via an SMA security cover external fastener 1654, as described in greater detail below with respect to FIG. 17C.

In one example embodiment, as depicted in FIG. 16, one or more extendable puck-mounted SMA adapters (e.g., 1652*a* or 1652*b*) that are operably coupled to an extendable puck antenna via an SMA cable may be disposed through the SMA adapter security cover apertures (e.g., 1651*a*, or 1651*b*, respectively). In some embodiments, this step may be performed prior to affixing the SMA security cover 1650 to the rear chassis wall, as described in greater detail with respect to FIG. 17C. In other embodiments, the SMA adapter security cover 1650 may be mounted to the rear chassis wall prior to insertion of the extendable puck-mounted SMA adapters (e.g., 1652*a* or 1652*b*) being disposed through the SMA adapter security cover apertures (e.g., 1651*a*, or 1651*b*, respectively), as described in greater detail with respect to FIG. 17D. Further, this step may be performed within the manufacturing facility, prior to affixing the SMA security cover to the shipping of the information handling system to an end customer in some embodiments. In other embodiments, the end customer may perform this step during setup of the information handling system.

Figure 17A:
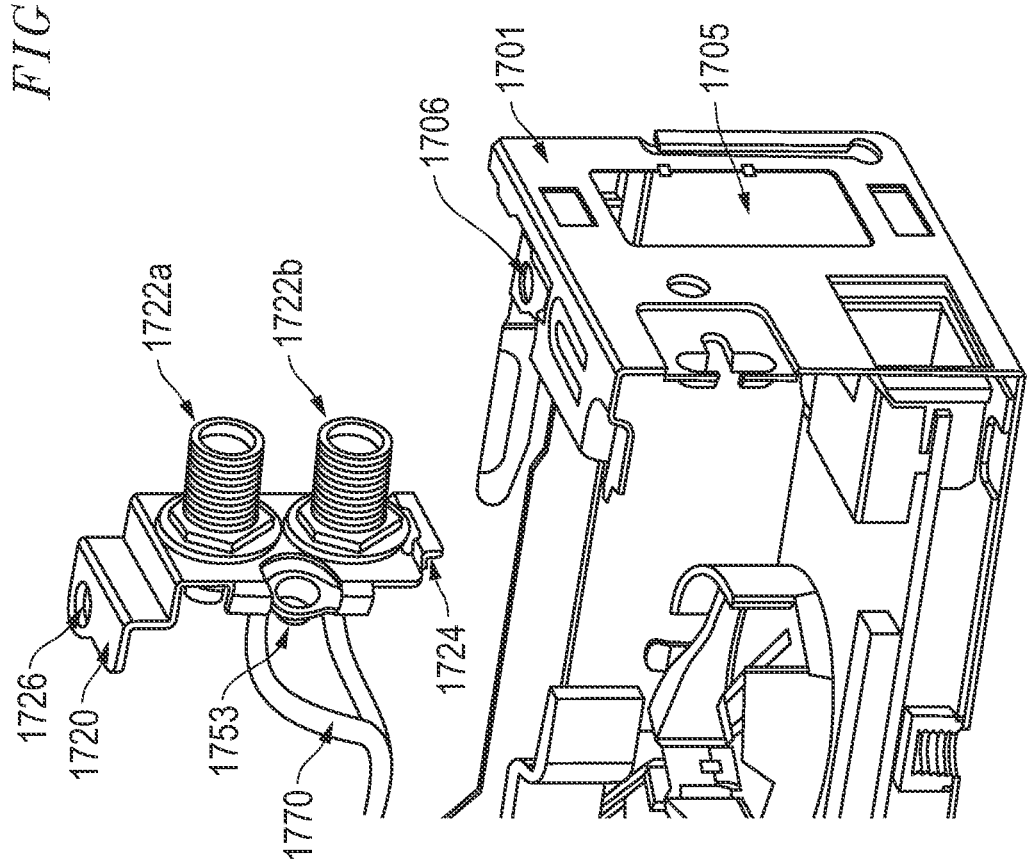
FIG. 17A is a cut-away view of an antenna module being partially inserted through an antenna mounting slot in a chassis rear wall according to an embodiment of the present disclosure.

FIG. 17A is a cut-away view of an SMA antenna module being partially inserted through an antenna mounting slot disposed through the rear wall of an information handling system chassis according to an embodiment of the present disclosure. As described herein, the antenna connector portion of the antenna module (e.g., incorporating the reconfigurable antenna grounding bracket 1720 and chassis-mounted SMA adapters 1722*a* and 1722*b*) in an embodiment may be inserted from the interior of the chassis through the antenna mounting insertion slot 1705 disposed through the chassis rear wall 1701. In an embodiment, the reconfigurable antenna module may be inserted in such a way, from the interior of the chassis, such that the majority of the antenna grounding bracket 1720 remains on the interior side of the chassis rear wall 1701. The reconfigurable antenna grounding bracket bottom lip 1724 in an embodiment may be inserted through the antenna mounting insertion slot 1705, such that the reconfigurable antenna grounding bracket bottom lip 1724 hooks over the exterior bottom edge of the antenna mounting insertion slot 1705. In such a way, the remainder of the reconfigurable antenna bracket 1720 disposed on the interior surface of the rear chassis wall 1701 may be maneuvered for fastening with the rear wall 1701 of the chassis. The reconfigurable antenna grounding bracket 1720 may be mechanically mounted to the interior of the chassis rear wall 1701 via an internal fastener, such as a screw, disposed through the internal fastener aperture 1726 in the reconfigurable antenna grounding bracket 1720, and disposed within the chassis internal fastener aperture 1706. The internal fastener may thus only be accessible from the interior of the chassis.

Figure 17B:
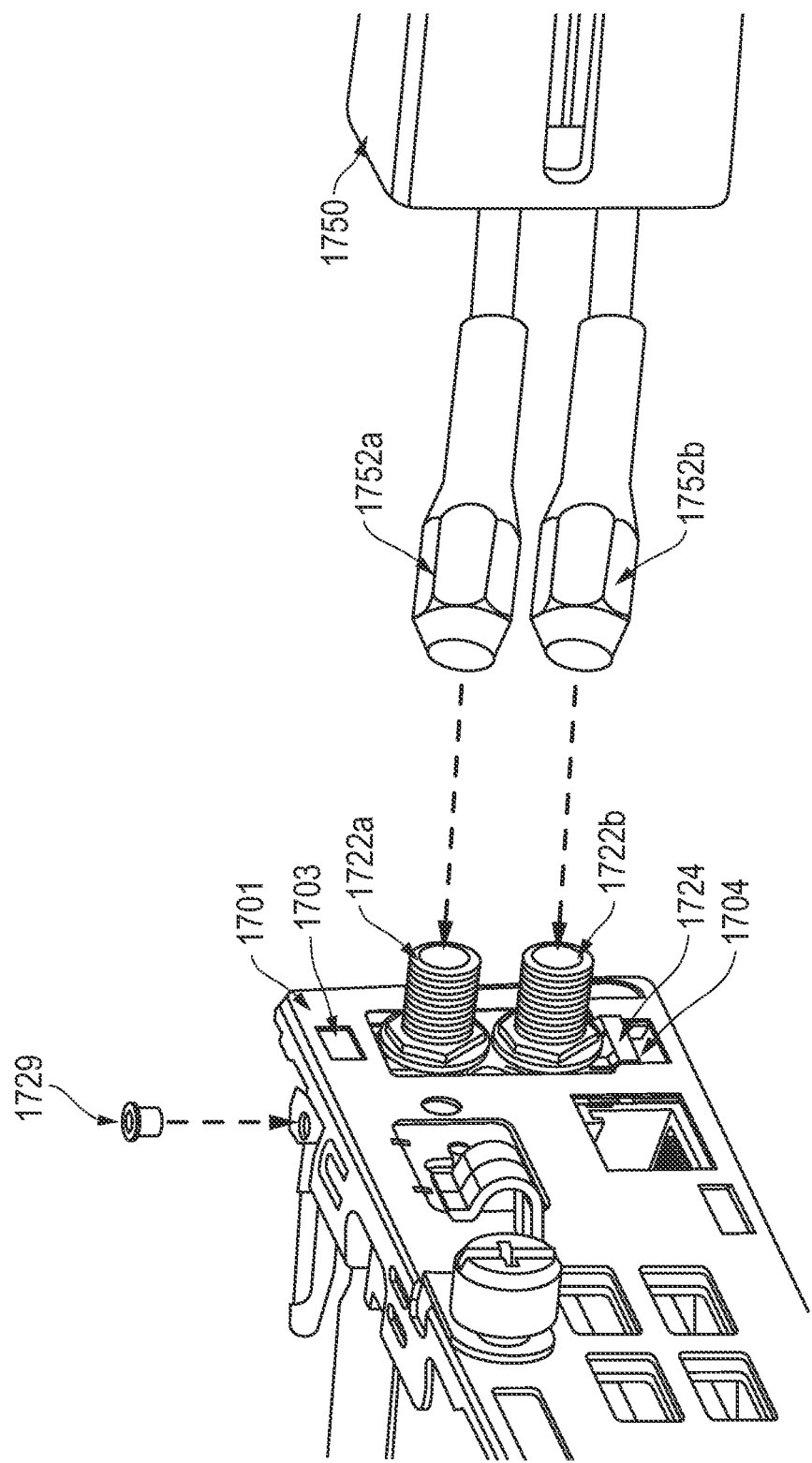
FIG. 17B is a cut-away view of a reconfigurable antenna grounding bracket mounted internally within a chassis with connecting external antenna cables according to an embodiment of the present disclosure.

FIG. 17B is a cut-away view of a reconfigurable antenna grounding bracket of an antenna module adapted for use with SMA adapters mounted internally within an information handling system chassis according to an embodiment of the present disclosure. As described herein, the reconfigurable antenna grounding bracket bottom lip 1724 in an embodiment may be inserted through the antenna mounting insertion slot, such that the reconfigurable antenna grounding bracket bottom lip 1724 hooks over the exterior bottom edge of the antenna mounting insertion slot on the exterior of the chassis rear wall 1701. The bracket internal fastener 1729 may secure the antenna module, including the chassis-mounted SMA adapters 1722*a* and 1722*b* in place with respect to the chassis rear wall 1701, and may only be accessible from the interior of the chassis. Thus, the reconfigurable antenna grounding bracket may be removed or separated from the rear chassis 1701 in an embodiment only by accessing the interior side of the chassis rear wall 1701.

The chassis 1701 may further incorporate one or more chassis security cover fastening apertures (e.g., 1703 and 1704) in the reconfigurable antenna grounding bracket mounted internally or in the rear chassis wall 1701 in various embodiments. In an embodiment, for example, as described with reference to FIGS. 17C and 17D, below, one or more SMA security cover fastening arms may be inserted into these chassis security cover fastening apertures (e.g., 1703 and 1704) in order to affix an SMA security cover to the rear chassis wall 1701.

Additionally, one or more extendable puck-mounted SMA cable adapters 1752a and 1752b may be operatively connected to the chassis-mounted SMA adapters 1722a, and 1722b, respectively. In such a way, the extendable puck antenna in an embodiment may be operatively connected to the network interface device of the information handling system enclosed within the chassis that includes the chassis rear wall 1701. As described above with respect to FIG. 16, this step may be performed prior to affixing an SMA security cover 1750 to the chassis rear wall 1701 (e.g., as described in greater detail with respect to FIG. 17C), after affixing an SMA security cover 1750 to the chassis rear wall 1701 (e.g., as described in greater detail with respect to FIG. 17D). FIG. 17B depicts operatively coupling the extendable puck-mounted SMA cable adapters 1752a and 1752b to the chassis-mounted SMA adapters 1722a and 1722b following insertion of the puck-mounted SMA cable adapters 1752a and 1752b through the SMA security cover 1750 (e.g., as described in greater detail above with respect to FIG. 16), and prior to mounting the SMA security cover 1750 to the chassis rear wall 1710.

Figure 17C:
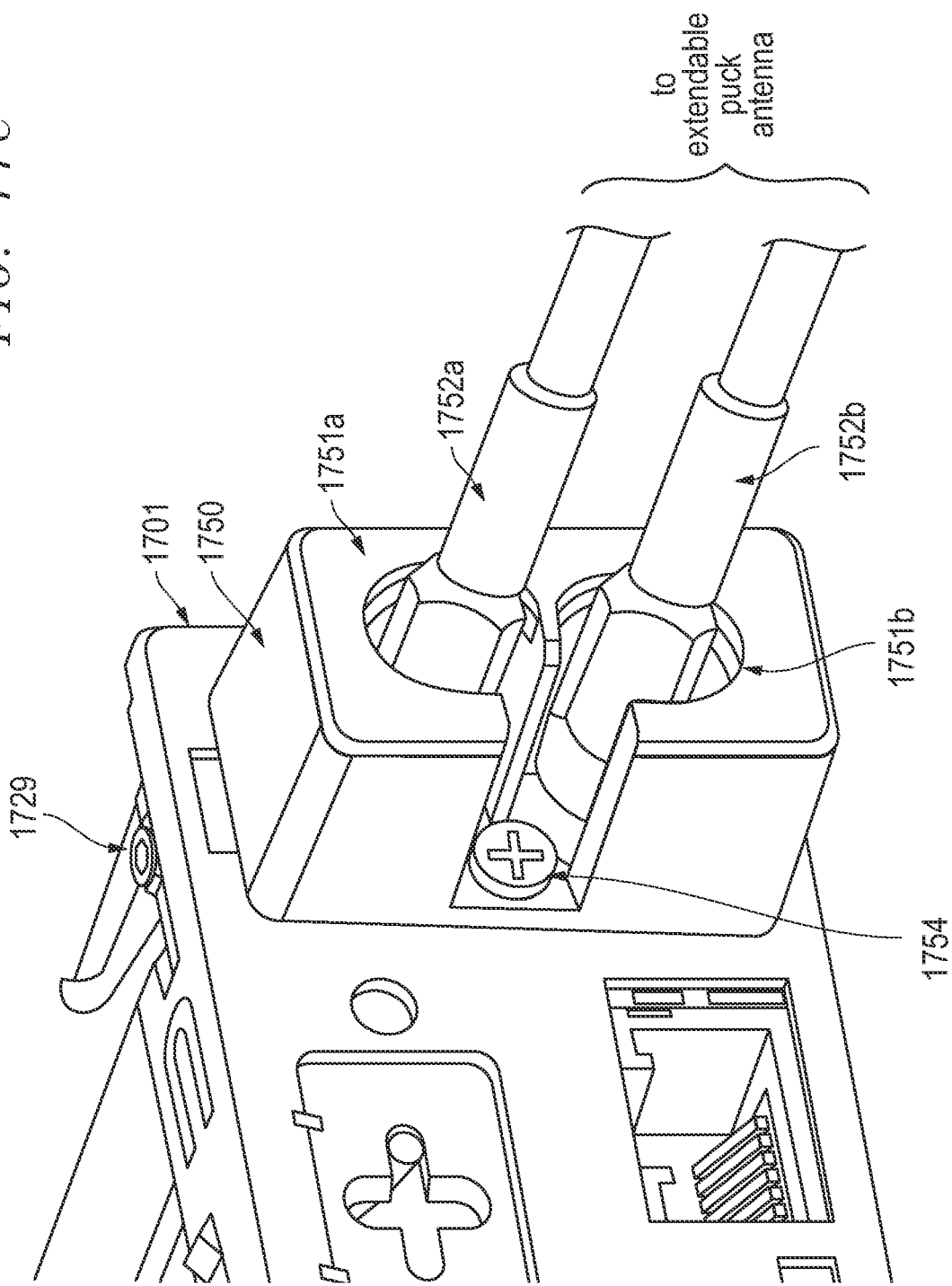
FIG. 17C is a cut-away view of an SMA antenna security cover affixed to an exterior surface of a chassis rear wall to according to an embodiment of the present disclosure.

FIG. 17C is a cut-away view of an SMA antenna security cover affixed to an exterior surface of a chassis rear wall, following attachment of an extendable puck antenna, to inhibit access to an antenna module partially housed therewithin according to an embodiment of the present disclosure. As described above with respect to FIG. 16, the puck-mounted SMA cable adapters 1752a and 1752b may be inserted through apertures within the SMA security cover 1750. In an embodiment described with respect to FIG. 17C, following this step, the SMA security cover 1750 may be affixed to the rear wall 1701 of the chassis via one or more fastening arms (e.g., 1655 described with reference to FIG. 16) of the SMA antenna security cover 1750 being disposed through security cover apertures (e.g., 1703 or 1704 described with reference to FIG. 17B) formed within the rear chassis wall 1701 itself. Such SMA security cover fastening arms in an embodiment may only be accessible from the interior of the rear chassis 1701. The SMA security cover 1750 in such an embodiment may further be externally secured to the chassis rear wall 1710 via an external fastener such as a screw being disposed through an SMA security cover external fastener (e.g., 1653 described with reference to FIG. 16), and a bracket external fastener aperture (e.g., 1525 described with reference to FIG. 15).

The SMA security cover 1750 in such an embodiment may inhibit or complicate the ability of a person to decouple the puck-mounted SMA adapters 1752a and 1752b from the chassis-mounted SMA adapters affixed to the chassis rear wall 1701, due to the narrow dimensions of the SMA adapter security cover apertures 1751a and 1751b. Thus, the SMA security cover 1750, puck-mounted SMA cable adapters 1752a and 1752b, and extendable puck antenna may be removed or separated from the rear chassis 1701 in such an embodiment only by accessing the interior side of the chassis rear wall 1701. In addition, a top cover may be joined to the rear wall 1701 so as to inhibit along with other chassis covers (e.g., bottom cover) access to the internal fastener 1729 mounting the reconfigurable antenna grounding bracket to the interior surface of the chassis rear wall 1701. For example, as described above with respect to FIG. 5, above, a top cover 505 may be joined with the rear chassis wall 501 to inhibit access to such an internal fastener. In such a way, the SMA security cover 1760 in an embodiment may enclose and secure at least a portion of the antenna module exterior to the chassis rear wall 1710 and may be removed only by internal access to the chassis rear wall 1701.

Figure 17D:
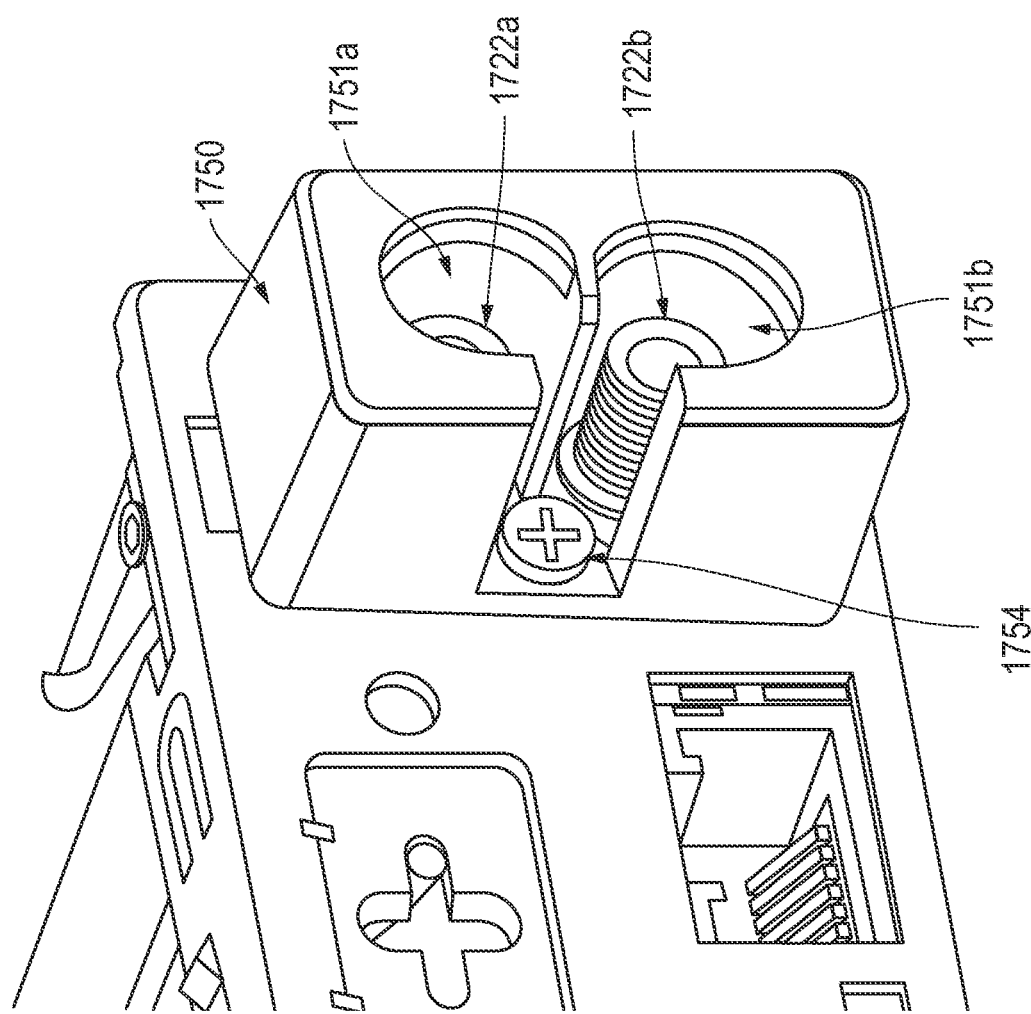
FIG. 17D is a cut-away view of an SMA antenna security cover affixed to an exterior surface of a chassis rear wall according to an embodiment of the present disclosure.

FIG. 17D is a cut-away view of an SMA antenna security cover affixed to an exterior surface of a chassis rear wall, prior to attachment of an extendable puck antenna, to inhibit access to an antenna module partially housed therewithin according to an embodiment of the present disclosure. As described herein, the SMA security cover 1750 in an embodiment may be affixed to the chassis rear wall 1701 prior to operatively connecting extendable puck-mounted SMA adapters to the chassis-mounted SMA adapters 1722a and 1722b. For example, the SMA security cover 1750 may be affixed to the rear wall 1701 of the chassis or reconfigurable antenna grounding bracket via one or more fastening arms (e.g., 1655 described with reference to FIG. 16) of the SMA antenna security cover 1750 being disposed through security cover apertures (e.g., 1703 or 1704 described with reference to FIG. 17B) formed within the rear chassis wall 1701 itself. Such SMA security cover fastening arms in an embodiment may only be accessible from the interior of the rear chassis 1701. The SMA security cover 1750 in such an embodiment may further be externally secured to the chassis rear wall 1710 via an external fastener such as a screw being disposed through an SMA security cover external fastener (e.g., 1653 described with reference to FIG. 16), and a bracket external fastener aperture (e.g., 1525 described with reference to FIG. 15).

The SMA security cover 1750 in such an embodiment may inhibit or complicate the ability of a person to remove the chassis-mounted SMA adapters affixed to the chassis rear wall 1701, via the reconfigurable antenna grounding bracket. Thus, the SMA security cover 1750, and the chassis-mounted SMA adapters 1751a and 1751b may be removed or separated from the rear chassis 1701 along with a bottom cover and side wall covers in such an embodiment only by accessing the interior side of the chassis rear wall 1701. In addition, a top cover may be joined to the rear wall 1701 so as to inhibit access to the internal fastener 1729 mounting the reconfigurable antenna grounding bracket to the interior surface of the chassis rear wall 1701. For example, as described above with respect to FIG. 5, above, a top cover 505 may be joined with the rear chassis wall 501 to inhibit access to such an internal fastener. In such a way, the SMA security cover 1760 in an embodiment may enclose and secure at least a portion of the antenna module exterior to the chassis rear wall 1710 and may be removed only by internal access to the chassis rear wall 1701.

Figure 18:
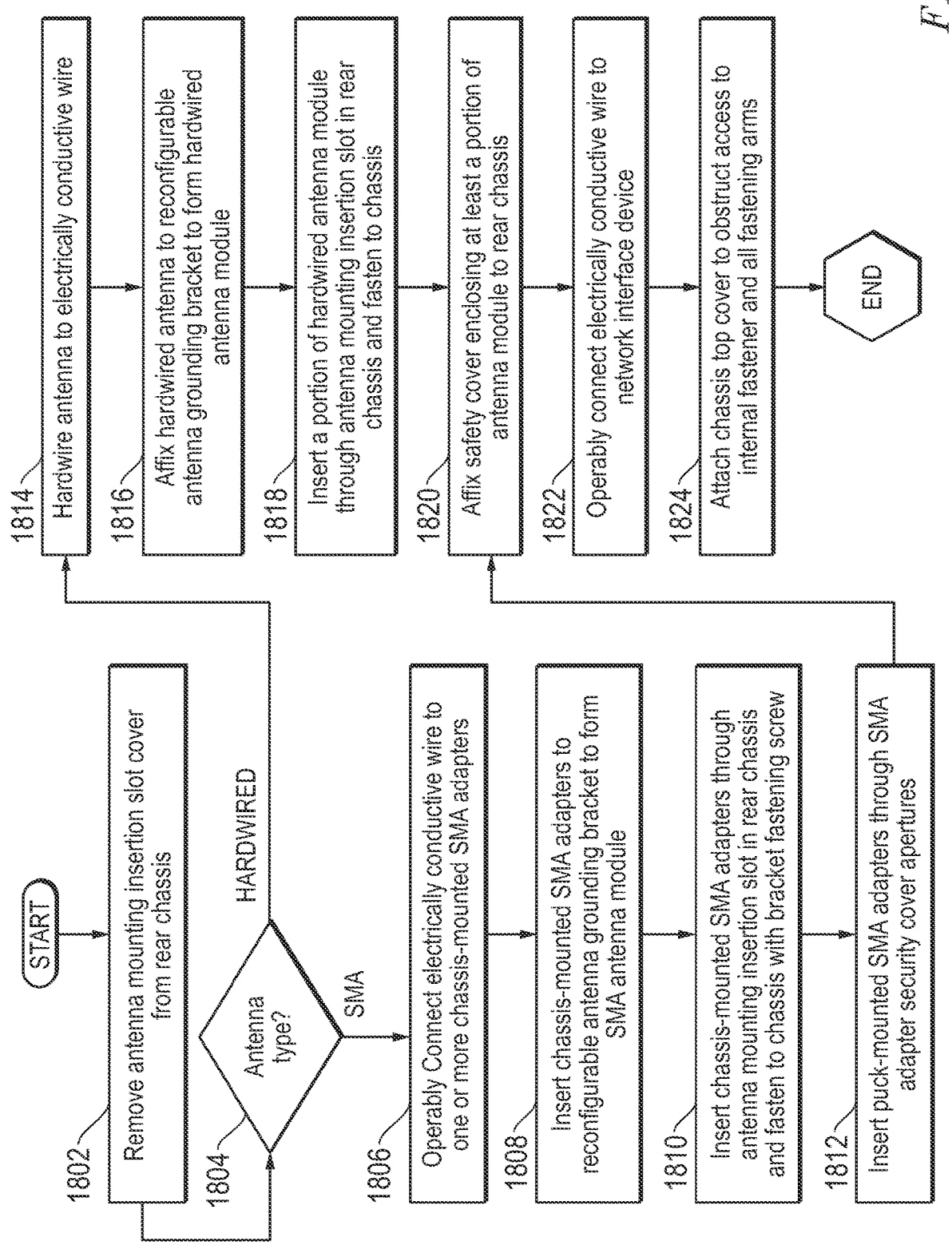
FIG. 18 is a flow diagram illustrating a method of assembling a secure antenna chassis enclosing a reconfigurable antenna assembly according to an embodiment of the present disclosure.

FIG. 18 is a flow diagram illustrating a method of assembling a secure antenna chassis enclosing a reconfigurable antenna assembly for an information handling system according to an embodiment of the present disclosure. As described herein, various embodiments described herein may provide a low-cost solution that securely mounts an antenna or a portion of an antenna module capable of transceiving within the 6 GHz Wi-Fi 6E spectrum within the chassis of an information handling system, without increasing the chassis base size or creating new input/output (I/O) ports within the chassis rear wall.

At block 1802, a removable antenna mounting insertion slot cover may be removed from a rear chassis wall in an embodiment. For example, in an embodiment described with reference to FIG. 2, the removable antenna mounting insertion slot cover 202 may be removed. As another example, in an embodiment described with reference to FIG. 14A, such a removal may open an antenna mounting insertion slot 1405 within a rear wall 1401 of a chassis enclosing an information handling system. As yet another example, in an embodiment described with reference to FIG. 17A, such a removal may open an antenna mounting insertion slot 1705 within a rear wall 1701 of a chassis enclosing an information handling system.

It may be determined at block 1804 whether the information handling system will be hardwired to an antenna mounted to the chassis, or will be operatively coupled to an extendable puck antenna via one or more SMA adapters. As described herein, various embodiments address these issues by assembling an antenna module that may be configured to incorporate several different types of antennas for mounting to the exterior rear wall of the chassis through a re-purposed SMA adapter port already included within previous chassis designs, such as the antenna mounting insertion slot cover described directly above with respect to block 1802. Such an antenna module may be assembled in various embodiments described herein by operably connecting one of a variety of different types of antennas (e.g., PIFA, Laser Direct Structure or "LDS," or extendable puck antenna) to the network interface device of the information handling system and to a reconfigurable antenna grounding bracket. In embodiments, the reconfigurable antenna grounding bracket may be adaptable for use with each of the variety of antennas, and may be configured for mounting internally within the chassis. If the information handling system will be operatively coupled to an extendable puck antenna, the method may proceed to block 1806 for operative coupling with one or more SMA adapters. If the information handling system will be hardwired to an antenna mounted to the chassis, the method may proceed to block 1814 for hardwired connection to such an antenna.

At block 1806, an electrically conductive wire may be operably connected to one or more chassis-mounted SMA adapters in an embodiment employing an SMA-connected, extendable puck antenna. For example, in an embodiment described with reference to FIG. 15, the electrically conductive wire 1570 may be operably connected to the chassis-mounted SMA adapters 1522. Chassis-mounted SMA adapters in an embodiment may be inserted through one or more apertures of a reconfigurable antenna grounding bracket at block 1808 to form an SMA antenna module. For example, the chassis-mounted SMA adapters 1522 in an embodiment may be inserted through the SMA adapter bracket apertures 1521a and 1521b, respectively. The chassis-mounted SMA adapters 1522 in such an embodiment may be fixed to the reconfigurable adapter grounding bracket 1520 via SMA adapter nuts 1523.

At block 1810, one or more chassis-mounted SMA adapters may be inserted through an antenna mounting insertion slot in the rear chassis and fastened to the chassis with a bracket fastening screw. For example, in an embodiment described with reference to FIGS. 17A and 17B, the chassis-mounted SMA adapters 1722a and 1722b may be inserted through the antenna mounting insertion slot 1705. A lower lip 1724 of the reconfigurable antenna grounding bracket 1720 in an embodiment may further be inserted through the antenna mounting insertion slot 1705 such that it protrudes below the slot 1705 on the exterior surface of the chassis rear wall 1701. The reconfigurable antenna grounding bracket 1720 may further be disposed beneath a portion of the chassis rear wall 1701 such that the reconfigurable antenna grounding bracket 1720 may be affixed thereto by insertion of an internal fastener 1729 through a chassis internal fastener aperture 1706 and through a bracket internal fastener aperture 1726.

One or more puck-mounted SMA cable adapters may be inserted through one or more SMA adapter security cover apertures in an embodiment at block 1812. For example, in an embodiment described with reference to FIG. 16, extendable puck-mounted SMA cable adapters 1652a and 1652b may be inserted through SMA security cover apertures 1651a and 1651b, respectively. The method may then proceed to block 1820 for affixing a security cover to the rear chassis wall. As described herein, in other embodiments, this step may be skipped, such that the puck-mounted SMA cable adapters are operatively coupled to the chassis-mounted SMA adapters following mounting of the SMA security cover to the chassis rear wall, as described at block 1820.

Returning to block 1804, if a hardwired antenna is to be installed, the method proceeds to block 1814. At block 1814, an electrically conductive wire may be hardwired to an antenna mounted on an antenna holder in an embodiment employing such a hardwired antenna. For example, in an embodiment described with reference to FIG. 9, a PIFA antenna 911 may be operatively connected to an electrically conductive wire or cable 970. As another example, in an embodiment described with reference to FIG. 10, an LDS antenna may be operatively connected to an electrically conductive wire or cable 1070.

The hardwired antenna in an embodiment may be affixed to the reconfigurable antenna grounding bracket to form a hardwired antenna module at block 1816. For example, in an embodiment described with reference to FIG. 11, an antenna holder 1131 housing the hardwired antenna (e.g., PIFA antenna 1111, or an LDS antenna) may be affixed to the reconfigurable antenna grounding bracket 1120. In such an embodiment, one or more antenna holder fastening arms (e.g., 1134a or 1134b) of the antenna holder 1131 may be inserted through one or more antenna holder fastening apertures (e.g., 1122a or 1122b) of the reconfigurable antenna grounding bracket 1120, such that the antenna holder 1131 may be detachable from the reconfigurable antenna grounding bracket 1120 only from the front face of the reconfigurable antenna grounding bracket 1120.

At block 1818, a portion of the hardwired antenna module may be inserted through the antenna mounting insertion slot in the rear chassis and fastened to the chassis in an embodiment. For example, in an embodiment described with reference to FIGS. 14A and 14B, the antenna holder 1430 and a bottom lip 1428 of the reconfigurable antenna grounding bracket 1420 may be inserted through the antenna mounting insertion slit 1405 in the chassis rear wall 1401 such that it protrudes below the slot 1405 on the exterior surface of the chassis rear wall 1401. The reconfigurable antenna grounding bracket 1420 may further be disposed beneath a portion of the chassis rear wall 1401 such that the reconfigurable antenna grounding bracket 1420 may be affixed thereto by insertion of an internal fastener 1429 through a chassis internal fastener aperture 1406 and through a bracket internal fastener aperture 1427.

A safety cover enclosing at least a portion of the antenna module in an embodiment may be affixed to a rear chassis wall at block 1820, either with one or more security cover apertures in the rear chassis wall, reconfigurable antenna grounding bracket, or some combination. For example, in an embodiment described with reference to FIG. 14C, a security cover 1460 may be affixed to the chassis rear wall 1401, such that it completely encloses the portion of the antenna holder and antenna disposed externally to the rear chassis wall 1401. As described in an embodiment with reference to FIG. 13, one or more security cover fastening arms (e.g., 1361 and 1362) may be inserted through security cover fastening apertures (e.g., 1123 described with reference to FIG. 11) hook over, or to snap fit into the apertures, such that the security cover 1360 may only be removed from the interior face of the reconfigurable antenna grounding bracket 1320 or the rear chassis wall 1301. Because the front face of the reconfigurable antenna grounding bracket 1320 or the rear chassis wall 1301 is only accessible from the interior of the chassis rear wall following block 1818, such mounting of the security cover to the reconfigurable antenna grounding bracket may only allow for removal of the security cover from the interior of the chassis.

In another embodiment employing an SMA extendable puck antenna, described with reference to FIG. 17C, an SMA security cover 1750 may be affixed to the rear chassis wall 1701, following operable connection of the puck-mounted SMA adapters 1751a and 1751b to chassis-mounted SMA adapters affixed to the rear chassis wall 1701. The SMA security cover 1750 in such an embodiment may include one or more SMA security cover fastening arms (e.g., 1655 described with reference to FIG. 16), which may be inserted through one or more chassis security cover fastening apertures (e.g., 1703 and 1704 of FIG. 17B) to hook over or snap fit into the apertures in the rear chassis wall or reconfigurable antenna grounding bracket. In such a way, the SMA security cover 1750 may be affixed to the chassis rear wall 1701 and may only be removed from the chassis rear wall 1701 by accessing the interior of the chassis. Further, the narrow dimensions of the SMA adapter apertures 1751a and 1751b may inhibit or complicate the ability to remove or decouple the puck-mounted SMA adapters 1752a and 1752b from the chassis-mounted SMA adapters (e.g., 1722a and 1722b described with reference to FIG. 17B).

In yet another example employing an SMA extendable puck antenna, described with reference to FIG. 17D, an SMA security cover 1750 may be affixed to the rear chassis wall 1701, prior to operable connection of the puck-mounted SMA adapters to the chassis-mounted SMA adapters 1722a and 1722b. The SMA security cover 1750 in such an embodiment may be affixed to the rear wall 1701 of the chassis via one or more fastening arms (e.g., 1655 described with reference to FIG. 16) of the SMA antenna security cover 1750 being disposed through security cover apertures (e.g., 1703 or 1704 described with reference to FIG. 17B) formed within the rear chassis wall 1701 itself. Such SMA security cover fastening arms in an embodiment may only be accessible from the interior of the rear chassis 1701. The SMA security cover 1750 in such an embodiment may inhibit or complicate the ability of a person to remove the chassis-mounted SMA adapters affixed to the chassis rear wall 1701. Thus, the SMA security cover 1750, and the chassis-mounted SMA adapters 1751a and 1751b may be removed or separated from the rear chassis 1701 in such an embodiment only by accessing the interior side of the chassis rear wall 1701.

At block 1822, an electrically conductive wire may be operably coupled to a network interface device of an information handling system enclosed within the chassis in an embodiment. For example, in an embodiment described with reference to FIG. 6, the electrically conductive wire 670 may be operatively connected to a hardwired antenna (e.g., as described above with respect to block 814), or operatively connected to an SMA adapter (e.g., as described above with respect to block 806). The electrically conductive wire 670 or cable incorporating such a wire may be operatively connected to the network interface device 640 of the information handling system disposed within the chassis incorporating the chassis rear wall 601. Upon such a coupling, any antenna operatively coupled to the network interface device 640 via the wire 670 may be capable of transceiving data according to the IEEE Wi-Fi 6E standard at frequencies at or above 6 GHz.

A chassis top cover may be attached to the chassis rear wall in an embodiment at block 1824, to obstruct access to internal fasteners and fastening arms. For example, in an embodiment described with reference to FIG. 5, a top cover 505 may be joined with the rear chassis wall 501 to inhibit access to any internal fasteners or fastening arms described herein. More specifically, the top cover in such an embodiment may inhibit access to the internal fastener affixing the reconfigurable antenna grounding bracket to the rear chassis wall (e.g., as described with reference to FIGS. 14A, 14B, 17A, and 17B), to antenna holder fastening arms affixing an antenna holder to the reconfigurable antenna grounding bracket (e.g., as described with reference to FIGS. 11 and 13), and to security cover fastening arms affixing a security cover either to the reconfigurable antenna grounding bracket (e.g., as described with reference to FIGS. 13 and 14C) or the rear chassis wall (e.g., as described with reference to FIGS. 17C and 17D). In such a way, various embodiments described herein may provide a low-cost solution that securely mounts an antenna or a portion of an antenna module capable of transceiving within the 6 GHz Wi-Fi 6E spectrum within the chassis of the information handling system, without increasing the chassis base size or creating new input/output (I/O) ports within the chassis rear wall. The method may then end.

The blocks of the flow diagrams of FIG. 18 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A secure antenna chassis access for a reconfigurable antenna assembly for an information handling system comprising:
   a chassis enclosing the information handling system including a top cover, a bottom cover and a rear chassis wall;
   an antenna mounting insertion slot within the rear chassis wall;
   a reconfigurable antenna grounding bracket with internal mounting portion configured to mount internally to the chassis of the information handling system via an internal fastener;
   the reconfigurable antenna grounding bracket including an antenna holder fastening aperture and a security cover fastening aperture;
   a first antenna, selected from a plurality of antenna types or an external puck antenna, operably coupled to a Wireless Local Area Network (WLAN) network interface device of the information handling system via an electrically conductive wire to transceive data at or above 6 GHz frequency;
   the first antenna operably coupled to the reconfigurable antenna grounding bracket to form an antenna module disposed through the antenna mounting insertion slot of the rear chassis wall from the interior of the chassis; and
   an antenna security cover enclosing at least a portion of the antenna module exterior to the chassis rear wall and secured against the chassis rear wall via a first antenna security cover fastener arm engaging through the security cover fastening aperture and with the reconfigurable antenna grounding bracket or engaging with the rear chassis wall through a chassis security cover fastening aperture through a first chassis fastening aperture in the rear chassis wall, where the antenna security cover encloses and secures at least a portion of the antenna module exterior to the chassis rear wall and is removed by internal access to the chassis.

2. The information handling system of claim 1, wherein the first antenna is a hardwired antenna within a radiofrequency transparent antenna holder mounted to the reconfigurable antenna grounding bracket to form the antenna module.

3. The information handling system of claim 1, wherein the first antenna is a Planar Inverted F-Antenna (PIFA) antenna within a transparent antenna holder mounted to the reconfigurable antenna grounding bracket to form the antenna module.

4. The information handling system of claim 1, wherein the antenna is a laser direct structure (LDS) hardwired antenna etched internally to a transparent antenna holder mounted to the reconfigurable antenna grounding bracket to form the antenna module.

5. The information handling system of claim 1 further comprising:

the internal fastener is a screw mechanically affixing the reconfigurable antenna grounding bracket to the interior surface of the chassis; and
   the top cover of the chassis mechanically joined with the rear chassis wall to inhibit access to the screw or the first antenna security cover fastener arm from the exterior of the chassis.

6. The information handling system of claim 1 further comprising
   a radiofrequency transparent antenna holder housing the portion of the antenna module exterior to the chassis rear wall configured to mechanically join to the reconfigurable antenna grounding bracket via one or more radiofrequency transparent antenna holder fastening arms inserted through antenna holder fastening apertures in the reconfigurable antenna grounding bracket to form the antenna module.

7. The information handling system of claim 1, wherein the antenna security cover fastening arm is selected from a deformable snap or a hook.

8. The information handling system of claim 1 further comprising:
   the reconfigurable antenna grounding bracket having at least one sub-miniature version A (SMA) adapter aperture;
   the antenna module housing at least one chassis-mounted SMA coaxial cable adapter external to the rear chassis wall; and
   the first antenna is an external puck antenna operably coupled to the antenna module and reconfigurable antenna grounding bracket via an SMA cable coupled to the SMA adapters in the antenna module.

9. The information handling system of claim 1 further comprising:
   the antenna security cover enclosing at least a portion of the antenna module exterior to the rear chassis wall and further mounted to the rear chassis wall via a second antenna security cover fastener arm engaging through a second chassis fastening aperture in the rear chassis wall, where the second antenna cover fastening arm is selected from a deformable snap or a hook.

10. An assembly method for a secure antenna chassis enclosing a reconfigurable antenna assembly for an information handling system comprising:
    operably coupling a first antenna, selected from a plurality of antenna types or an external puck antenna to a Wireless Local Area Network (WLAN) network interface device of the information handling system via an electrically conductive wire to transceive data at or above 6 GHz frequency;
    forming an antenna module by operably coupling the first antenna to a reconfigurable antenna grounding bracket with an internal mounting portion;
    partially disposing the antenna module through an antenna mounting insertion slot within a rear chassis wall of the chassis of the information handling system from an interior of the chassis and internally mounting the internal mounting portion of the reconfigurable antenna grounding bracket to the chassis via an internal fastener;
    enclosing at least a portion of the antenna module exterior to the chassis rear wall via an antenna security cover;
    securing the antenna module against the chassis rear wall via a first antenna security cover fastener arm engaging through a security cover fastening aperture within the reconfigurable antenna ground bracket or engaging with the rear chassis wall through a chassis security cover fastening aperture through a first chassis fastening aperture in the rear chassis wall; and affixing a top chassis cover to the rear chassis wall such that the antenna security cover encloses and secures the portion of the antenna module exterior to the chassis rear wall and is removed by internal access to the chassis.

11. The method of claim 10, wherein the first antenna is a hardwired antenna within a radiofrequency transparent antenna holder mounted to the reconfigurable antenna grounding bracket to form the antenna module.

12. The method of claim 10 further comprising:
securing the top chassis cover to the rear chassis wall via a keyed chassis lock (K-lock) disposed within a K-lock aperture of the rear chassis wall.

13. The method of claim 10 further comprising:
securing the top chassis cover to the rear chassis wall via a padlock disposed within a padlock loop aperture of the rear chassis wall.

14. The method of claim 10 further comprising:
mechanically joining the top cover of the chassis with the rear chassis wall to inhibit access to the internal fastener or the first antenna security cover fastener arm from the exterior of the chassis.

15. The method of claim 10 further comprising:
inserting at least one sub-miniature version A (SMA) coaxial cable adapter through an SMA adapter insertion hole within the reconfigurable antenna grounding bracket and through an SMA adapter port opening within the security cover;
operably coupling an external puck antenna forming the first antenna to the antenna module and reconfigurable antenna grounding bracket via an SMA cable coupled to the SMA coaxial cable adapter in the antenna module.

16. The method of claim 10 further comprising:
enclosing at least a portion of the antenna module exterior to the rear chassis wall via the antenna security cover; and
mounting the antenna module to the rear chassis wall via a second antenna security cover fastener arm engaging through a second chassis fastening aperture in the rear chassis wall, where the second antenna cover fastening arm is selected from a deformable snap or a hook.

17. A secure antenna chassis access for an information handling system reconfigurable antenna comprising:
a chassis enclosing the information handling system including a top cover, and a rear chassis wall;
an antenna mounting insertion slot within the rear chassis wall;
a reconfigurable antenna grounding bracket with an internal mounting portion configured to mount internally to the chassis via an internal fastener;
a hardwired antenna operably coupled to a Wireless Local Area Network (WLAN) network interface device of the information handling system via an electrically conductive wire to transceive data at or above 6 GHz frequency;
the hardwired antenna operably disposed through the antenna mounting insertion slot of the rear chassis wall from the interior of the chassis and coupled to the reconfigurable antenna grounding bracket internally mounted to the chassis; and
an antenna security cover enclosing the hardwired antenna and removable by internal access to the chassis.

18. The information handling system of claim 17 further comprising:
the reconfigurable antenna grounding bracket including an antenna holder fastening aperture and a security cover fastening aperture;
a radiofrequency transparent antenna holder housing the hardwired antenna configured to mechanically join to the reconfigurable antenna grounding bracket via a radiofrequency transparent antenna holder fastening arm inserted through the antenna holder fastening aperture; and
the antenna security cover secured against the chassis rear wall via an antenna security cover fastener arm engaging through the security cover fastening aperture.

19. The information handling system of claim 17, wherein the first antenna is a Planar Inverted F-Antenna (PIFA) antenna housed within a transparent antenna holder mounted to the reconfigurable antenna grounding bracket.

20. The information handling system of claim 17, wherein the antenna is a laser direct structure (LDS) hardwired antenna etched internally to a transparent antenna holder mounted to the reconfigurable antenna grounding bracket.

* * * * *